(12) United States Patent
Ono et al.

(10) Patent No.: US 11,054,385 B2
(45) Date of Patent: Jul. 6, 2021

(54) GAS SENSOR

(71) Applicant: Hitachi Metals, Ltd., Tokyo (JP)

(72) Inventors: Kazuo Ono, Tokyo (JP); Yoshitaka Sasago, Tokyo (JP)

(73) Assignee: Hitachi Metals, Ltd., Tokyo (JP)

( * ) Notice: Subject to any disclaimer, the term of this patent is extended or adjusted under 35 U.S.C. 154(b) by 385 days.

(21) Appl. No.: 16/027,677

(22) Filed: Jul. 5, 2018

(65) Prior Publication Data

US 2019/0033250 A1 Jan. 31, 2019

(30) Foreign Application Priority Data

Jul. 31, 2017 (JP) .............................. JP2017-147998

(51) Int. Cl.
*G01N 27/414* (2006.01)
*H01L 23/34* (2006.01)
*H01L 29/49* (2006.01)
*H01L 29/10* (2006.01)
*H01L 29/16* (2006.01)

(52) U.S. Cl.
CPC ..... *G01N 27/4141* (2013.01); *G01N 27/4148* (2013.01); *H01L 23/345* (2013.01); *H01L 29/495* (2013.01); *H01L 29/1087* (2013.01); *H01L 29/1608* (2013.01); *H01L 29/4958* (2013.01)

(58) Field of Classification Search
None
See application file for complete search history.

(56) References Cited

U.S. PATENT DOCUMENTS 8,080,805 B2 12/2011 Gordon et al.
8,106,723 B2 1/2012 Watanabe
(Continued)

FOREIGN PATENT DOCUMENTS

JP 2009-300297 A 12/2009
JP 2010-28792 A 2/2010
(Continued)

OTHER PUBLICATIONS

Japanese-language Office Action issued in Japanese Application No. 2017-147998 dated Oct. 27, 2020 with English translation (nine (9) pages).

*Primary Examiner* — Matthew D Krcha
*Assistant Examiner* — Brittany I Fisher
(74) *Attorney, Agent, or Firm* — Crowell & Moring LLP

(57) ABSTRACT

A gas sensor capable of stably detecting a gas concentration with a high reliability even under a high temperature environment is provided. The gas sensor includes an element unit having a capacitance value changing in accordance with a gas concentration, an inductor forming a resonant circuit in cooperation with the element unit, a phase detection circuit detecting a phase difference between a standard frequency and a resonant frequency of the resonant circuit, and a feedback unit supplying, to the element unit, a voltage changing in accordance with the phase difference detected by the phase detection circuit. The capacitance value of the element unit is controlled by the voltage from the feedback unit so as to reduce the phase difference between the resonant frequency and the standard frequency, and a gas concentration detection output is output based on the phase difference.

3 Claims, 16 Drawing Sheets

(56) References Cited

U.S. PATENT DOCUMENTS

| | | | |
|---|---|---|---|
| 8,253,426 B2 | 8/2012 | Tateishi et al. | |
| 10,571,422 B2 | 2/2020 | Mitsunaka et al. | |
| 2010/0231239 A1* | 9/2010 | Tateishi | G01P 15/125 324/672 |
| 2011/0169057 A1 | 7/2011 | Tsukada | |
| 2013/0186178 A1* | 7/2013 | Usagawa | B82Y 15/00 73/31.06 |

FOREIGN PATENT DOCUMENTS

| | | |
|---|---|---|
| JP | 2010-127927 A | 6/2010 |
| JP | 2011-185933 A | 9/2011 |
| JP | 2016-20815 A | 2/2016 |
| WO | WO 2009/050813 A1 | 4/2009 |
| WO | WO 2017/077782 A1 | 5/2017 |

* cited by examiner

FIG. 13A
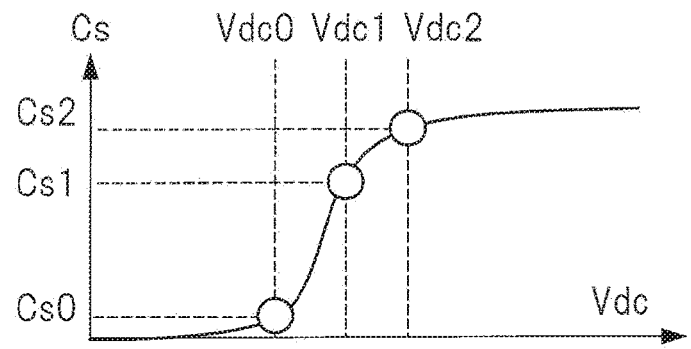
FIG. 13B
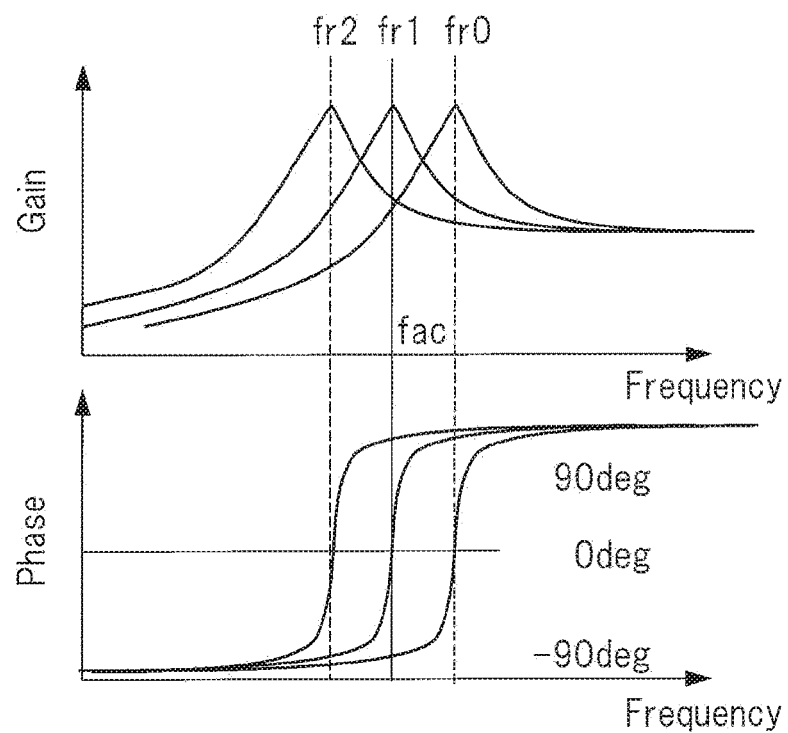
FIG. 13C
$$fr = \frac{1}{2\pi}\sqrt{\frac{C0 + Cs}{LCsC0}}$$

GAS SENSOR

CROSS-REFERENCE TO RELATED APPLICATION

The present application claims priority from Japanese Patent Application No. 2017-147998 filed on Jul. 31, 2017, the content of which is hereby incorporated by reference into this application.

TECHNICAL FIELD OF THE INVENTION

The present invention relates to a gas sensor, and relates to, for example, a gas sensor which includes a field effect type sensor.

BACKGROUND OF THE INVENTION

A gas sensor outputs a gas concentration detection signal (hereinafter, simply referred to as "gas concentration detection output") changing in accordance with a gas concentration in atmosphere. Such gas sensors are used as gas concentration meter and leak detector for preventing explosion of a combustible gas such as hydrogen and methane and preventing an adverse influence on a human body due to a poisonous gas such as nitrogen oxide, hydrogen sulfide, and carbon monoxide.

An application example exemplifying hydrogen as a gas to be detected is cited as follows. For example, in order to suppress a $CO_2$ emission amount of a vehicle from the viewpoint of global environmental protection, development of a fuel cell vehicle (FCV) which uses a hydrogen as a fuel and which only emits water even in combustion has advanced. On the FCV, it is particularly required to mount a hydrogen concentration meter for controlling a hydrogen concentration at the time of hydrogen combustion and for detecting hydrogen leakage from a pipe. In addition, a hydrogen detector is also used in a nuclear power generator.

It is known that hydrogen causes explosion when its concentration in the air reaches 3.9%. Therefore, for the application of detecting the hydrogen leakage, it is required to consider a countermeasure for safety so that the hydrogen concentration meter issues an alert before the concentration reaches the explosion limit concentration (3.9%). In addition, since the combustion performance in the FCV can be improved by optimizing the hydrogen concentration at the time of combustion, it is required to monitor the hydrogen concentration also for performing feedback to a combustion condition.

Meanwhile, recently, a field effect type (hereinafter, also referred to as "FET") gas sensor using silicon carbide has been proposed, the silicon carbide being as a semiconductor material which is operable even under a high temperature environment exceeding 500° C. It has been expected that the gas sensor which is operable even under the high temperature environment is used to detect a NOx emission amount of a diesel vehicle. In other words, since the gas sensor is operable at a high temperature, the sensor can be mounted without any additional device which is used to decrease a temperature of exhaust gas. In addition, it is considered that the gas sensor has a merit that can take off (remove) soot stains adhered on a surface of the gas sensor by the high temperature. As a result, a mounting cost caused when the gas sensor is mounted and a device cost for neutralizing the NOx can be possibly reduced.

As a type of the gas sensor, several types such as a contact combustion type, a semiconductor type, and a gas thermal conductivity type are known. In recent years, attention has been paid to an FET gas sensor of the semiconductor type gas sensor. This is because the FET gas sensor can accurately detect a low concentration of gas and can be manufactured in a process using a semiconductor wafer, and therefore, a low cost, downsizing, and a low power consumption can be achieved. In particular, in an application for a vehicle, attention has been paid to the FET gas sensor because of a high resistance against cyclic siloxane. It is known that the cyclic siloxane is emitted from asphalt used for road pavement and from a product made of silicon toward an environmental atmosphere, and can be a cause of a conductivity failure at a contact of an electric product at a high temperature. However, a catalytic activity (activation of a catalytic action) of the FET gas sensor is hardly changed even in the atmosphere of the cyclic siloxane.

A technique of detecting the gas using the FET gas sensor is described in, for example, Japanese Patent Application Laid-open Publication No. 2011-185933 (Patent Document 1). In the Patent Document 1, the gas is detected by using change in a threshold voltage of an FET device configuring the FET gas sensor due to the gas.

In addition, Japanese Patent Application Laid-open Publication No. 2016-20815 (Patent Document 2) describes a sensor IC focusing on a biosensor. Regarding the sensor IC, the document describes that an oscillator which generates a signal with a resonant frequency is configured by a variable capacitive element and an inductor, and that the sensor detects changes in a magnetic permeability and a dielectric constant of a sample.

SUMMARY OF THE INVENTION

The FET gas sensor includes a gate electrode, a source electrode, and a drain electrode as similar to a field effect transistor (FET) device such as an FET. For example, it is known that, when the FET device is operated under such a high temperature environment as exceeding 500° C., it is difficult to keep a good contact state between a diffusion layer and the source electrode/the drain electrode, the state largely affecting current-voltage characteristics of the FET.

At the contact portions of the source electrode/drain electrode, a metal layer (for example, an aluminum layer) where the source electrode and the drain electrode are formed is bonded to a semiconductor layer (diffusion layer). The good contact state means a state in which the contact forms an ohmic contact. In the case of the ohmic contact, the current-voltage characteristics of the contact portion are in a proportional relation. However, under the high temperature environment, the contact is not the ohmic contact but a contact represented by a Schottky contact. In other words, a non-linear property is observed in the current-voltage characteristics of the contact portion.

Since the non-linear property is observed in the current-voltage characteristics of the contact portion, the current-voltage characteristics of the FET gas sensor are also non-linear, and thus, correction is required. Further, the non-linear property of the current-voltage characteristics changes depending on the ambient temperature, and thus, the correction is required in accordance with the temperature change. A cost required for data processing of such corrections is increased. Because of such a problem, a method of detecting a change of a threshold voltage on the basis of the current-voltage characteristics of the FET device as described in the Patent Document 1 is not an optimal method from the viewpoint of the operation of the FET gas sensor under the high temperature environment.

In addition, in a case of a technique of detecting the change of the resonant frequency described in the Patent Document 2, it is required to additionally provide a circuit that detects the variation of the resonant frequency. Further, in an application having a drifting (change) risk of the sensor output due to accumulated charges as observed in the FET gas sensor, it is difficult to use the technique.

Further, in the Patent Documents 1 and 2, a problem due to the non-linear property of the contact portion caused under the high temperature environment is not recognized.

An object of the present invention is to provide a gas sensor which can stably detect a gas concentration with a high reliability even under high temperature environment.

The above and other object and novel characteristics of the present invention will be apparent from the description of the present specification and the accompanying drawings.

The summary of the typical aspects of the inventions disclosed in the present application will be briefly described as follows.

A gas sensor according to an embodiment includes: an element unit including a capacitance with a value changing in accordance with a gas concentration; an inductor being connected to the element unit and forming a resonant circuit in cooperation with the capacitance of the element unit; a phase detection circuit detecting a phase difference between a standard frequency and a resonant frequency of the resonant circuit; and a feedback unit supplying a voltage changing in accordance with the phase difference detected by the phase detection circuit, to the element unit. Herein, the value of the capacitance of the element unit is controlled by the voltage from the feedback unit to reduce the phase difference between the resonant frequency and the standard frequency, and a gas concentration detection output is output based on the phase difference.

The effects obtained by the typical aspects of the present invention will be briefly described below.

It is possible to provide a gas sensor which can detect a gas concentration with a high reliability even when a contact state is degraded under the high temperature environment. In addition, the feedback control is performed to keep the capacitance of the element unit constant. Therefore, it is possible to provide a gas sensor which hardly causes the drifting due to the accumulated charges and which can detect the gas concentration with a high stability. Since the capacitance is controlled to be constant by the feedback, it is possible to provide a gas sensor which can minimize an influence of the accumulated charges in the element unit.

BRIEF DESCRIPTIONS OF THE DRAWINGS

FIG. 13A is a diagram for describing an operation of the detection gas sensor according to the fourth embodiment;

FIG. 13B is a diagram for describing the operation of the detection gas sensor according to the fourth embodiment;

FIG. 13C is a diagram for describing the operation of the detection gas sensor according to the fourth embodiment;

DESCRIPTIONS OF THE PREFERRED EMBODIMENTS

Hereinafter, embodiments of the present invention will be described in detail based on the accompanying drawings. Note that the same components are denoted by the same reference symbols in principle throughout all the drawings for describing the embodiments, and the repetitive description thereof will be omitted in principle.

Hereinafter, the description will be made on the basis of an FET hydrogen sensor as an example of the FET gas sensor. In the FET gas sensor, various types of gases can be detected by changing a type of a catalytic metal. Therefore, the following description is not limited to hydrogen. In addition, the following description will be made about a case in which an N-channel FET is used as the FET gas sensor as an example. When a P-channel FET is used, it is only required to inverse a direction of an applying voltage, and therefore, this example is obviously applicable.

First Embodiment

<Hydrogen Detection Mechanism>

First, a hydrogen detection mechanism using the FET hydrogen sensor will be described. Although not particularly limited, the FET hydrogen sensor (FET gas sensor) according to the embodiment includes a reference FET sensor (hereinafter, simply referred to as reference FET) and a detection FET sensor (hereinafter, simply referred to as sensor FET). While an example of the FET hydrogen sensor which includes the reference FET and the sensor FET as described above will be described in detail later with reference to FIG. 16, a difference between respective hydrogen concentration detection outputs from the sensor FET and the reference FET is obtained, and an upstream system is notified of the difference as the hydrogen concentration detection output from the FET hydrogen sensor.

Figure 1A:
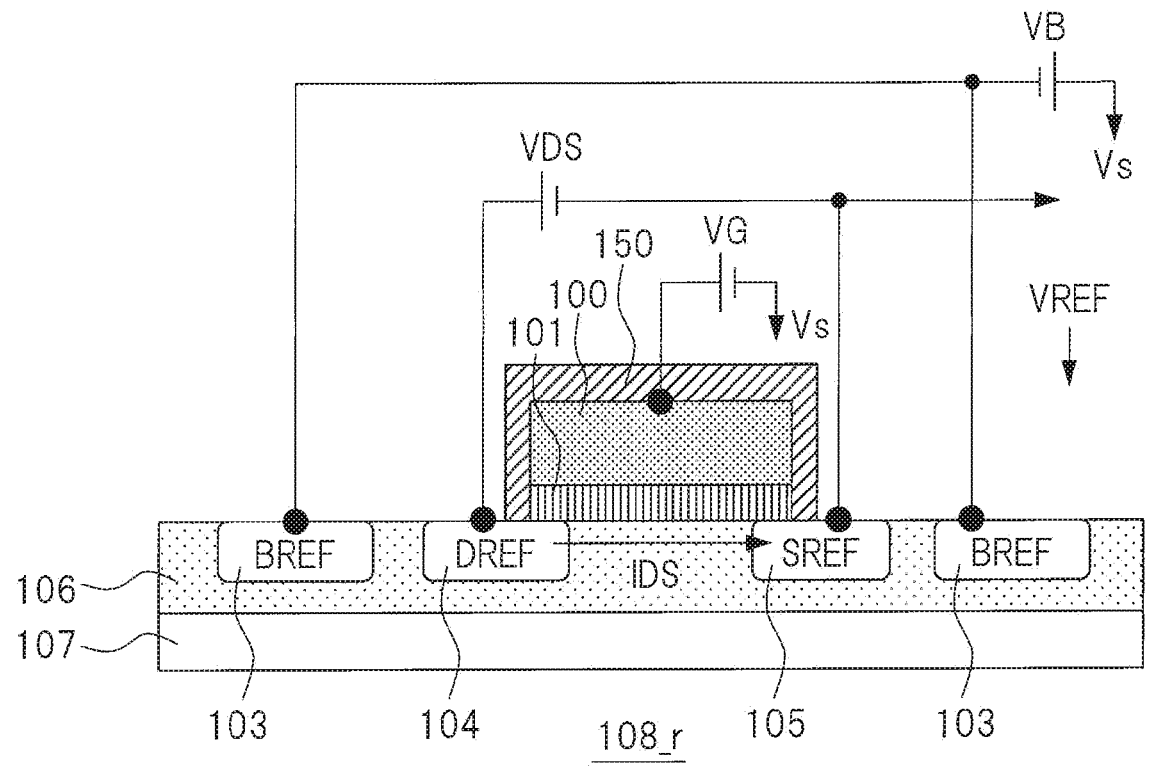
FIG. 1A is a cross-sectional view illustrating a configuration of a reference FET or a sensor FET.
Figure 1B:
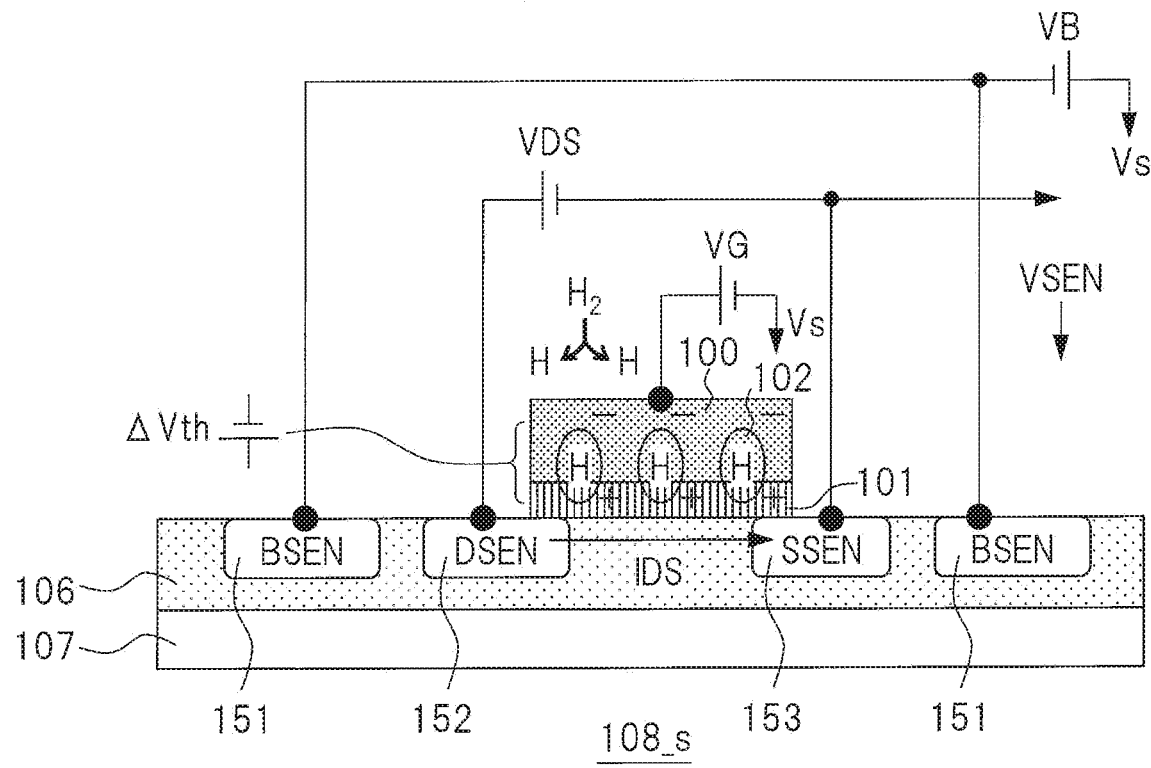
FIG. 1B is a cross-sectional view illustrating a configuration of the reference FET or the sensor FET.

Each of FIGS. 1A and 1B is a cross-sectional view illustrating a configuration of the reference FET or the sensor FET. Herein, FIG. 1A is a cross-sectional view illustrating an outline of the structure of the reference FET, and FIG. 1B is a cross-sectional view illustrating an outline of the structure of the sensor FET. In FIGS. 1A and 1B, a symbol "FET 108_r" represents the reference FET, and a symbol "FET 108_s" represents the sensor FET. This drawing separately illustrates the reference FET 108_r and the sensor FET 108_s. However, the reference FET 108_r and the sensor FET 108_s are formed on the same silicon substrate (SUB) 107 by a publicly-known semiconductor process. In addition, the reference FET 108_r and the sensor FET 108_s are formed so as to have almost the same configurations including configurations of a size, a film and a layer. A main difference is whether a detection target blocking film described later exists.

One silicon substrate 107 is continuously formed and connected on FIGS. 1A and 1B. In the silicon substrate 107, a well region (WELL) 106 is formed. Although not particularly limited, the well region 106 is also continuously formed and connected on FIGS. 1A and 1B. In the well region 106, the reference FET 108_r and the sensor FET 108_s are formed in regions adjacent to each other. In other words, in the well region 106 formed on the silicon substrate 107, the reference FET 108_r and the sensor FET 108_s are formed so as to be adjacent to each other.

Each of the reference FET 108_r and the sensor FET 108_s includes a gate electrode, a source electrode, and a drain electrode. The source electrode is bonded to a source semiconductor layer (diffusion layer) which is formed in the well region 106. The drain electrode is bonded to a drain semiconductor layer (diffusion layer) which is formed in the well region 106. Although not particularly limited, the source electrode and the drain electrode are metal electrodes each of which is made of aluminum, and these metal electrodes are bonded to the source semiconductor layer and the drain semiconductor layer.

In FIG. 1A, a symbol "104 (DREF)" represents the drain semiconductor layer of the reference FET 108_r, and a symbol "105 (SREF)" represents the source semiconductor layer of the reference FET 108_r. Similarly, in FIG. 1B, a symbol "152 (DSEN)" represents the drain semiconductor layer of the sensor FET 108_s, and a symbol "153 (SSEN)" represents the source semiconductor layer of the sensor FET 108_s.

Such a catalytic metal as detecting the gas is used as a gate electrode 100 of each of the reference FET 108_r and the sensor FET 108_s. In the embodiment, the gate electrode 100 is an electrode which is activated by a hydrogen gas, and is formed of, for example, a Pt—Ti—O (platinum-titanium-oxide) laminated film or a Pd (palladium) film. Note that the gate electrode 100 will be also referred to as a catalytic gate electrode (CATGATE) 100 below. A gate insulating film (OXIDE) 101 interposed between the well region 106 and the catalytic gate electrode 100 is formed of an $SiO_2$ (silicon oxide) film as similar to a normal FET.

In comparison between the reference FET 108_r and the sensor FET 108_s, the catalytic gate electrode 100 of the reference FET 108_r is covered with a detection target blocking film 150 (PASSI). The detection target blocking film 150 is formed of a film which has a low permeability to a detection target gas. Since the hydrogen gas is the detection target gas in the embodiment, a film having a low permeability to hydrogen, more desirably having no permeability thereto, is selected as the detection target blocking film 150. As the detection target blocking film 150, for example, a SiN (silicon nitride) film is used. In the reference FET 108_r, the catalytic gate electrode 100 is covered with the detection target blocking film 150, and thus, the hydrogen gas does not reach the catalytic gate electrode 100. In this manner, the reference FET 108_r has a similar configuration to that of the sensor FET 108_s but has no hydrogen sensitivity.

Obviously, the materials of the reference FET 108_r and the sensor FET 108_s are not limited to the above-described materials.

Next, a bias condition which is used when the sensor FET 108_s and the reference FET 108_r are operated is described. In the present specification, when a semiconductor layer and an electrode bonded to the semiconductor layer are not separately described but collectively described below, they are referred to as "terminal" in some cases. For example, when the drain semiconductor layer and the drain electrode bonded to the drain semiconductor layer are collectively described, they are also referred to as "drain terminal". When the source semiconductor layer and the source electrode bonded to the source semiconductor layer are collectively described, they are also referred to as "source terminal".

Between the drain terminal and the source terminal of the sensor FET 108_s and the reference FET 108_r, the drain-source voltage VDS having the same voltage value is supplied. In this manner, in the sensor FET 108_s, a channel current IDS flows between the drain semiconductor layer DSEN and the source semiconductor layer SSEN. Similarly, also in the reference FET 108_r, the channel current IDS flows between the drain semiconductor layer DREF and the source semiconductor layer SREF.

In addition, to the catalytic gate electrodes 100 of the sensor FET 108_s and the reference FET 108_r, the gate voltage VG having the same voltage value is supplied. In this case, the gate voltage VG is a potential (gate potential) with respect to a ground voltage Vs, but not a potential at the source terminal.

In the well region 106, semiconductor layers 103 (BREF) and 151 (BSEN) having the same conductivity type as that of the well region are formed. These semiconductor layers 103 (BREF) and 151 (BSEN) are also bonded to metal electrodes to form well terminals. Herein, the semiconductor layer 103 (BREF) and the metal electrode bonded to the semiconductor layer 103 (BREF) are referred to as a well terminal 103 (BREF). Similarly, the semiconductor layer 151 (BSEN) and the metal electrode bonded to the semiconductor layer 151 (BSEN) are referred to as a well terminal 151 (BSEN). In the sensor FET 108_s, a portion of the well region 106, the portion facing the catalytic gate electrode 100 through the gate insulating film 101, serves as a substrate gate electrode of the sensor FET 108_s. Similarly, in the reference FET 108_r, a portion of the well region 106, the portion facing the catalytic gate electrode 100 through the gate insulating film 101, serves as a substrate gate electrode of the reference FET 108_r. Since the well terminal 103 (BREF) and the substrate gate electrode of the reference FET 108_r have the same potential, the well terminal 103 (BREF) is regarded as the substrate gate electrode of the reference FET 108_r. Similarly, the well terminal 151 (BSEN) is regarded as the substrate gate electrode of the sensor FET 108_s.

Although not particularly limited, a substrate voltage VB is supplied to the substrate gate electrodes (the well terminals 151 and 103) of the sensor FET 108_s and the reference FET 108_r. In the drawing, the substrate voltage VB is a potential with respect to the ground voltage Vs. In other words, the substrate voltage VB is not a potential with respect to the potential at the source terminal. Obviously, the substrate voltage VB may be not supplied to the well terminals 151 and 103 but connected to the source terminals of the sensor FET 108_s and the reference FET 108_r. In such a case, there is no potential difference between the substrate gate electrode and the source semiconductor layers SSEN and SREF, and therefore, occurrence of a substrate effect in the sensor FET 108_s and the reference FET 108_r can be prevented.

When the sensor FET 108_s and the reference FET 108_r are in the hydrogen gas atmosphere, the hydrogen gas ($H_2$) in the sensor FET 108_s is dissolved into hydrogen atoms (H) or hydrogen ions by a catalytic action of the catalytic gate electrode 100 as illustrated in FIG. 1B. The dissolved hydrogen atoms or hydrogen ions are stored in the catalytic gate electrode 100 so that a dipole 102 is formed near a boundary between the catalytic gate electrode 100 and the gate insulating film 101. With an action of the dipole 102, a threshold voltage in the sensor FET 108_s changes by ΔVth. The threshold voltage of the sensor FET 108_s is output as an output voltage VSEN of the sensor FET 108_s. Therefore, when the hydrogen gas is detected, the output voltage VSEN of the sensor FET 108_s changes by ΔVth.

On the other hand, since the catalytic gate electrode 100 in the reference FET 108_r is covered with the detection target blocking film 150, the hydrogen gas is not dissolved by the catalytic action, and thus, the dipole 102 is not formed. Therefore, even when the reference FET 108_r is in the hydrogen gas atmosphere, the threshold voltage does not change. The threshold voltage of the reference FET 108_r is output as an output voltage (standard voltage or reference voltage) VREF of the reference FET 108_r. However, even when the reference FET 108_r is in the hydrogen gas atmosphere, there is no change.

The reference FET 108_r and the sensor FET 108_s have the same size as and a similar configuration to each other, and are disposed close to each other. In this manner, the threshold voltage obtained when the sensor FET 108_s is not detecting the hydrogen gas is almost equal to the threshold voltage of the reference FET 108_r. Therefore, the threshold voltage obtained when the sensor FET 108_s is detecting the hydrogen gas changes by a voltage (ΔVth) in accordance with a concentration of the hydrogen gas with reference to the threshold voltage of the reference FET 108_r by the action of the dipole.

Therefore, by the comparison between the output voltage VSEN and the standard voltage VREF, the hydrogen concentration can be identified.

Figure 2A:
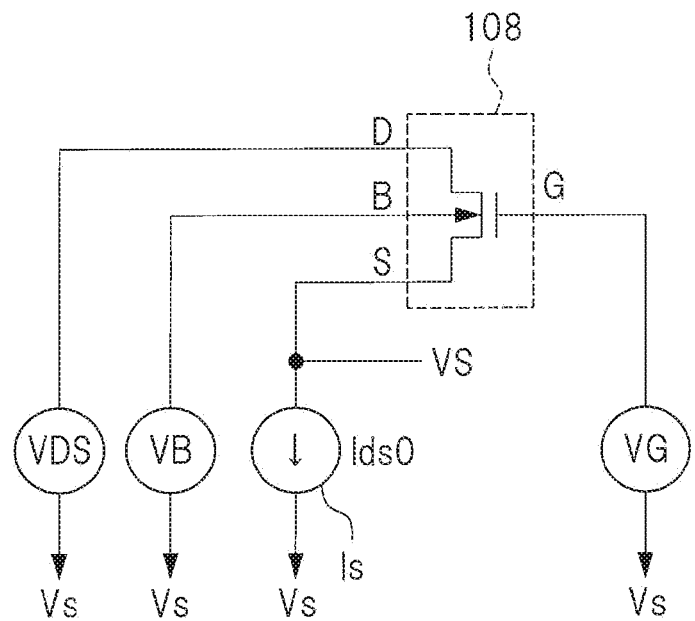
FIG. 2A is an explanatory diagram for describing a hydrogen detection mechanism.
Figure 2B:
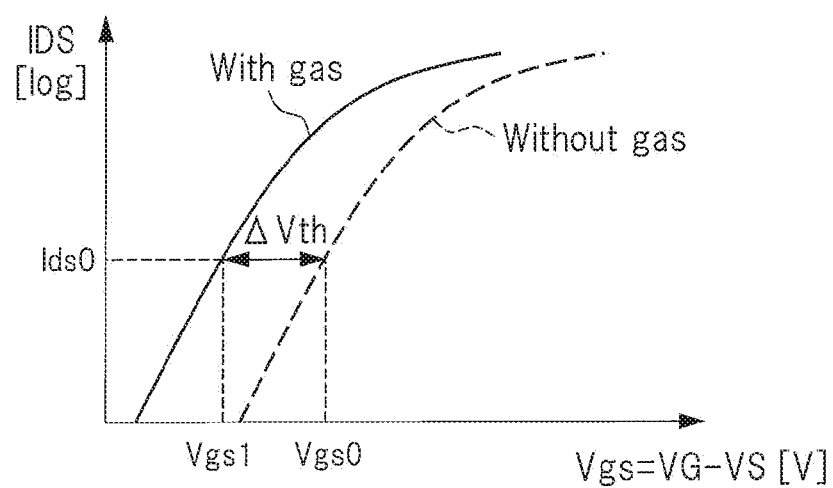
FIG. 2B is an explanatory diagram for describing a hydrogen detection mechanism.

Each of FIGS. 2A and 2B is a diagram for describing a hydrogen detection mechanism. Herein, FIG. 2A is a circuit diagram illustrating a configuration made for acquiring current-voltage characteristics of the reference FET and the sensor FET, and FIG. 2B is a characteristic diagram illustrating the current-voltage characteristics of the sensor FET. In FIGS. 2A and 2B, a numerical symbol "108" represents the sensor FET or the reference FET. In order to acquire the current-voltage characteristics of the sensor FET, the sensor FET 108_s is used as the FET 108 of FIG. 2A. In order to acquire the current-voltage characteristics of the reference FET, the reference FET 108_r is used as the FET 108 of FIG. 2A. Herein, the case of the sensor FET 108_s used as the FET 108 is described. Hereinafter, the FET 108 illustrated in FIG. 2A is also referred to as the sensor FET 108 unless otherwise particularly specified.

In FIG. 2A, a symbol "G" represents the gate electrode of the sensor FET 108, a symbol "D" represents the drain electrode of the sensor FET 108, a symbol "S" represents the source electrode of the sensor FET 108, and a symbol "B" represents the substrate gate electrode (the well terminal 151) of the sensor FET 108. In addition, in FIG. 2A, the drain-source voltage VDS with reference to the ground voltage Vs is supplied to the drain electrode D. Similarly, the gate voltage VG and the substrate voltage VB with reference to the ground voltage Vs are also supplied to the gate electrode G and the substrate gate electrode B. In FIG. 2A, a symbol "Is" represents a current source which is connected between the source electrode S and the ground voltage Vs of the sensor FET 108. A drain current expressed by Ids0 is caused to flow in the current source Is while the drain-source voltage VDS, the gate voltage VG, and the substrate voltage VB are supplied. A source voltage in the source electrode S of the sensor FET 108 obtained at this time is represented by a symbol "VS" of FIG. 2A. The source voltage VS is also a potential with reference to the ground voltage Vs.

A gate-source voltage of the sensor FET 108 is obtained from a difference between the gate voltage VG and the source voltage VS caused when the drain current flowing in the current source Is becomes Ids0, and the current-voltage characteristics indicating a relation between the drain current and the gate-source voltage is acquired. FIG. 2B illustrates the current-voltage characteristics acquired as described above.

FIG. 2B illustrates the current-voltage characteristics obtained when the hydrogen gas are detected ("With gas"; hereinafter, also referred to as "at the time of gas detection") and when the hydrogen gas are not detected ("Without gas"; hereinafter, also referred to as "at the time of normal state"). In other words, in FIG. 2B, a solid line represents the characteristics at the time of gas detection, and a broken line represents the characteristics at the time of normal state. Herein, a horizontal axis represents the gate-source voltage Vgs of the sensor FET 108, and a vertical axis represents a (logarithmic) drain current IDS.

The current source "Is" is controlled so as to cause the drain current IDS with a value to flow, in which the time of gas detection and the time of normal state to flow are the same as each other. In this manner, the time of gas detection and the time of normal state are the same as each other in an operation current of the sensor FET 108. In addition, the gate voltage VG with a value and the drain-source voltage VDS with a value are supplied to the sensor FET 108 so that the time of gas detection and the time of normal state are the same as each other in the values. In this manner, the time of gas detection and the time of normal state are the same as each other in a shape of the current-voltage characteristics. However, since the dipole 102 is generated at the time of gas detection, the threshold voltage of the sensor FET 108 changes by ΔVth due to the dipole 102. In other words, the current-voltage characteristics (solid line) at the time of gas detection is shaped to be shifted toward a negative side of the voltage Vgs from the current-voltage characteristics (broken line) at the time of normal state. The shifted voltage amount becomes ΔVth.

In description of such a control case as causing the value of the drain current IDS to be Ids0 as an example, the voltage change ΔVth of the threshold voltage due to the gas is expressed as a difference between a gate-source voltage Vgs0 at the time of normal state and a gate-source voltage Vgs1 at the time of gas detection. As described above, the gate voltage VG is set to have a value in which the time of gas detection and the time of normal state are the same as each other. Therefore, each of the gate-source voltages Vgs0 and Vgs1 can be obtained by a difference between the gate voltage VG and the source voltage VS (Vgs=VG−VS). The voltage change ΔVth is finally detected as a difference in the source voltage VS between the time of gas detection and the time of normal state.

When the reference FET 108_r is used as the FET 108 of FIG. 2A, the voltage change ΔVth due to the gas is not caused because of the existence of the detection target blocking film 150. Therefore, at both the time of gas detection and the time of normal state, the current-voltage characteristics of the FET 108 become the characteristics as illustrated with the broken line in FIG. 2B. Therefore, the hydrogen gas can be detected by comparing the source voltage VS of the reference FET 108_r and the source voltage VS of the sensor FET 108_s.

The mechanism of the hydrogen detection according to the embodiment has been described above.

The gas sensor according to the embodiment is used for various applications, and is set in various places. In explanation on the hydrogen gas sensor as an example, the hydrogen gas sensor is used for an application in a fuel cell vehicle. In this case, it is considered that the hydrogen gas sensor is set near a hydrogen supply port of a vehicle, near an inlet/outlet of a hydrogen reservoir tank, near a hydrogen supply port of a power device, in an exhaust system, and/or in the vehicle. In addition, the hydrogen gas sensor is used for a nuclear reactor of nuclear power generation. In this case, it is considered that the gas sensor is set in a nuclear reactor building, a control room which is a nuclear reactor auxiliary building or others. Further, the hydrogen gas sensor is usable for general hydrogen detection in a hydrogen infrastructure, and can be also set, for example, in a hydrogen station or near a supply port of a hydrogen dispenser.

In addition, when an NOx sensor is taken as an example, it is considered that the NOx sensor is set in, for example, an exhaust system of a diesel vehicle to detect an exhaust NOx concentration, and is applied to the control on an air-fuel mixture of a diesel engine and the control on an NOx neutralizing device on the basis of the detection information.

As described above, the mounting cost in the mounting of the gas sensor and the device cost can be reduced by the operation of the gas sensor under the high temperature environment. In addition, the above-described catalytic action can be more activated by the operation of the gas sensor at a high temperature, and therefore, for example, a detection speed can be increased. Next, problems in the operation of the sensor FET described in FIGS. 1A and 1B and FIGS. 2A and 2B under the high temperature environment will be described in detail.

<Problem Under High Temperature Environment>

Figure 3A:
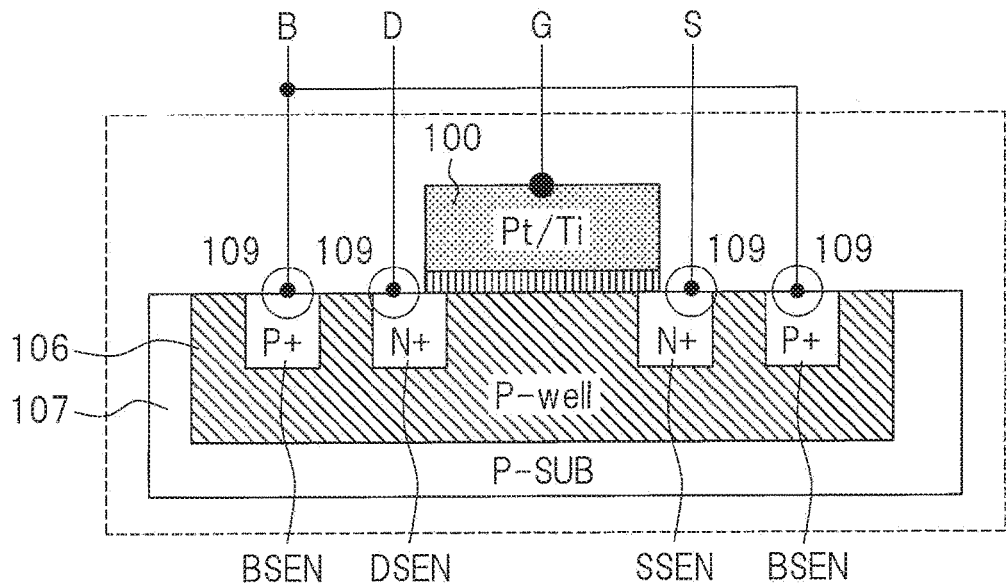
FIG. 3A is a diagram for describing a problem in a case in which the sensor FET operates under a high temperature environment.
Figure 3B:
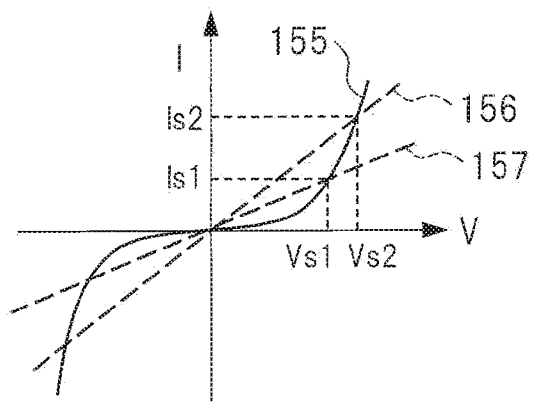
FIG. 3B is a diagram for describing the problem in the case in which the sensor FET operates under the high temperature environment.
Figure 3C:
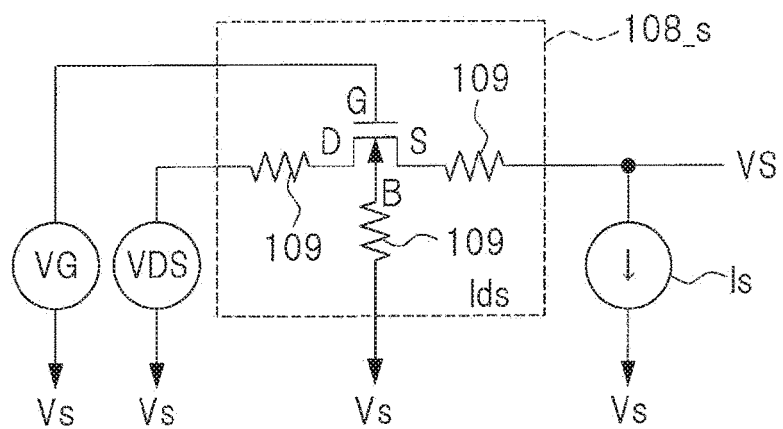
FIG. 3C is a diagram for describing the problem in the case in which the sensor FET operates under the high temperature environment.

FIGS. 3A to 3C are diagrams for describing the problems in the operation of the sensor FET under the high temperature environment. Herein, FIG. 3A is a cross-sectional view illustrating a configuration of the sensor FET 108_s. Since the sensor FET 108_s according to the embodiment is an N-channel FET (device), each of the source semiconductor layer SSEN and the drain semiconductor layer DSEN is formed of an N-type semiconductor layer (N+). In addition, although not particularly limited, the silicon substrate 107 and the well region 106 are P-type semiconductor layers (P-SUB, P-well). The semiconductor layer BSEN which is formed in the well region 106 and which forms the well terminal is also a P-type semiconductor layer (P+) as similar to that of the well region 106. Note that the drawing shows that the semiconductor layer denoted with a symbol "+" has a higher concentration than that of a semiconductor layer denoted without the symbol. In addition, in the drawing, a symbol "Pt/Ti" represents that the gate electrode 100 is a Pt—Ti laminated film.

The drain terminal of the sensor FET 108_s includes the drain semiconductor layer DSEN and the drain electrode which is bonded to the drain semiconductor layer DSEN, and the source terminal of the same includes the source semiconductor layer SSEN and the source electrode which is bonded to the source semiconductor layer SSEN. In addition, the well terminal of the sensor FET 108_s includes the semiconductor layer BSEN and an electrode which is bonded to the semiconductor layer BSEN, and the well terminal operates as a substrate gate terminal of the sensor FET 108_s. In FIG. 3A, a symbol "109" represents a bonding portion (contact portion) at which the semiconductor layer and an electrode made of a metal are bonded to each other. For example, the bonding portion between the drain semiconductor layer DSEN and the drain electrode (metal electrode) is encircled by "O" with the symbol "109". In the drawing, while a symbol "G" represents the gate electrode of the sensor FET 108_s, the symbol may be considered as representing the gate terminal. Similarly, while symbols "D", "S", and "B" represent the drain electrode, the source electrode, and the substrate gate electrode of the sensor FET 108_s, respectively, the symbols may be considered as representing the drain terminal, the source terminal, and the substrate gate terminal, respectively.

At the contact portion 109, it is desirable to form the ohmic contact for the bonding between the metal electrode and the semiconductor layer. However, when the sensor FET 108_s is operated under the high temperature environment, the Schottky contact is formed for the bonding at the contact portion 109. FIG. 3B is a schematic characteristic diagram illustrating current-voltage characteristics of the Schottky contact. A horizontal axis of FIG. 3B indicates an applying voltage "V" which is applied to the metal electrode and the semiconductor layer contacted as the Schottky contact, and a vertical axis of the same indicates a current "I" which flows to the metal electrode and the semiconductor layer. As illustrated in FIG. 3B, current-voltage characteristics 155 of the Schottky contact becomes nonlinear so that the current I rapidly changes when the applying voltage V exceeds a specific voltage. In other words, a relation between the voltage V and the current I is nonlinear.

When the applying voltage V is changed, for example, from Vs1 to Vs2, the current I does not linearly change with respect to the change from Vs1 to Vs2. In other words, a current Is1 which is expressed at an intersection with a broken line 157 flows at the voltage Vs1, and a current Is2 which is expressed at an intersection with a broken line 156 having a different slope from the broken line 157 flows at the voltage Vs2. In the case of the Schottky contact, the current I nonlinearly changes depending on the applying voltage V. On the other hand, if the ohmic contact is formed at the contact portion 109, the broken line 157 and the broken line 156 have the same slope as and overlap each other. In other words, the current I linearly changes depending on the applying voltage V.

FIG. 3C is a diagram for describing influence on the sensor FET 108_s when the Schottky contact is formed at the contact portion 109. Although the drawing is similar to FIG. 2A, the substrate voltage VB is omitted for ease of explanation. In FIG. 3C, the contact portion 109 is equivalently illustrated as a resistance element. If the ohmic contact is formed at the contact portion 109, a resistance value of the equivalent resistance element 109 is constant without depending on the applying voltage so that the broken lines 156 and 157 overlap each other as described in FIG. 3B. On the other hand, if the Schottky contact is formed at the contact portion 109, the resistance value of the equivalent resistance element 109 is changed by the applying voltage so that the broken lines 156 and 157 have different slopes from each other as illustrated in FIG. 3B.

A case in which the threshold voltage of the sensor FET 108_s changes in accordance with a gas concentration is considered, the case being performed in such a state as supplying the constant drain-source voltage VDS and the constant gate voltage VG to the sensor FET 108_s to flow the constant drain current Is. Since the resistance value of the equivalent resistance element 109 indicating the Schottky contact is nonlinearly changed by a voltage applied to the equivalent resistance element 109, the source voltage VS is changed by a change of the resistance value of the equivalent resistance element 109. Therefore, it is considered that a voltage change caused by the nonlinearity of the current-voltage characteristics of the Schottky contact is superimposed on the voltage change caused by the threshold voltage so as to be observed as a change of the source voltage VS. In addition, the current-voltage characteristics 155 of the Schottky contact is also changed by a change in an ambient temperature surrounding the sensor FET 108_s. It is also considered that the voltage change caused by the nonlinearity of the current-voltage characteristics which is changed by the ambient temperature change is superimposed on the threshold voltage change so as to be observed as the change of the source voltage VS. In summary, it is considered that nonlinearity of electric conduction based on the Schottky contact is superimposed on the threshold voltage change so as to be observed as the change of the source voltage VS.

From the change of the source voltage VS, it is difficult to identify the threshold voltage change caused by the gas concentration change and the superimposed changes caused by the nonlinearity of the current-voltage characteristics and by the ambient temperature change. As a result, it is considered that reliability of the detection by the gas sensor is reduced.

<Principle of Gas Detection Using Electrostatic Capacitance>

In the first embodiment, in order to avoid the influence caused by the nonlinearity of the electric conduction based on the Schottky contact, the gas concentration is detected by using a fact that a depletion layer of the sensor FET 108_s changes in accordance with a concentration of a detection target gas (hydrogen gas in the embodiment). The change of the depletion layer of the sensor FET 108_s can be recognized as a change of the electrostatic capacitance between the gate electrode G and the source electrode S or/and the drain electrode D of the sensor FET 108_s. The electrostatic capacitance corresponds to a so-called MOS capacitive element which is configured by the sensor FET 108_s.

Figure 4A:
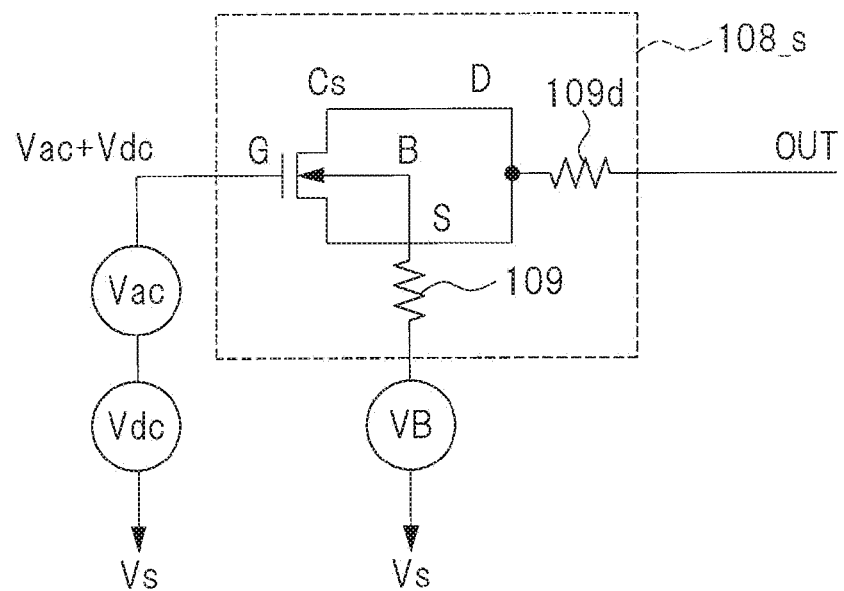
FIG. 4A is a diagram for describing a principle of gas detection according to a first embodiment.
Figure 4B:
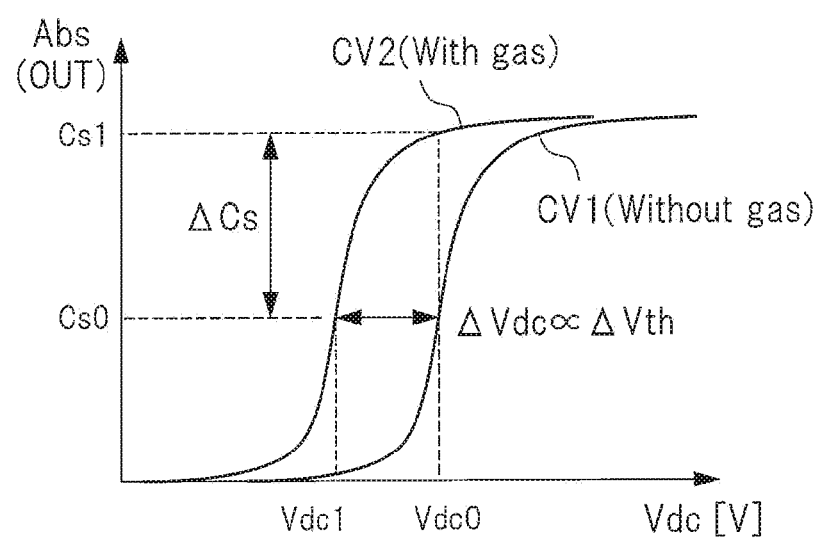
FIG. 4B is a diagram for describing the principle of the gas detection according to the first embodiment.

Each of FIGS. 4A and 4B is a diagram for describing a principle of the gas detection according to the first embodiment. FIG. 4A is a circuit diagram for describing the principle of the gas detection, and FIG. 4B is a characteristic diagram for describing the principle of the gas detection. Next, the principle will be described by using FIGS. 4A and 4B.

In order to operate the sensor FET 108_s as the MOS capacitive element, the source electrode S and the drain electrode D of the sensor FET 108_s are connected to each other. In the drawing, the symbol "109" represents the equivalent resistance element described with reference to FIGS. 3A to 3C, and the well region forming the substrate gate electrode B of the sensor FET 108_s is connected to a direct-current voltage source through the equivalent resistance element 109. The direct-current voltage source supplies the substrate voltage VB based on the ground voltage Vs to the well region which forms the substrate gate electrode B of the sensor FET 108_s through the equivalent resistance element 109. In addition, a symbol "109d" also represents an equivalent resistance element, and the equivalent resistance element 109d represents a combined equivalent resistance element of the equivalent resistance element 109 accompanying the source electrode S of the sensor FET 108_s (see FIG. 3C) and the equivalent resistance element 109 accompanying the drain electrode D (see FIG. 3C).

The direct-current voltage source Vdc and an alternating-current voltage source Vac are connected in series between the gate electrode G of the sensor FET 108_s and the ground voltage Vs. The direct-current voltage source Vdc generates a direct-current voltage (gate-source voltage) Vdc based on the ground voltage Vs. In addition, the alternating-current voltage source Vac generates an alternating-current voltage Vac with a predetermined frequency. The alternating-current voltage Vac is superimposed on the direct-current voltage Vdc, and supplied to the gate electrode G of the sensor FET 108_s. In other words, a voltage (Vac+Vdc) which is a sum of the direct-current voltage Vdc and the alternating-current voltage Vac based on the ground voltage Vs is applied to the gate electrode G. In other words, the direct-current voltage Vdc becomes an offset voltage based on the ground voltage Vs, and a signal changed by a frequency of the alternating-current voltage Vac is supplied to the gate electrode G of the MOS capacitive element. In the drawing, a symbol "Cs" represents a capacitance of the MOS capacitive element which is configured by the sensor FET 108_s, and a symbol "OUT" represents an output signal of the sensor FET 108_s.

A capacitance Cs is measured from an alternating-current amplitude of a potential of the output signal OUT while changing the direct-current voltage Vdc which is generated by the direct-current voltage source Vdc. A degree of spread of the depletion layer of the sensor FET 108_s is determined on the basis of a voltage component of the direct-current voltage Vdc supplied to the gate electrode G and the threshold voltage of the sensor FET 108_s. Briefly, the degree of the spread of the depletion layer is determined on the basis of a difference between the direct-current voltage Vdc and the threshold voltage or the basis of a sum of them. The capacitance Cs of the MOS capacitive element which is configured by the sensor FET 108_s is determined by the degree of the spread of the depletion layer. Therefore, when the threshold voltage is constant, the capacitance Cs changes in accordance with the change of the direct-current voltage Vdc. Since the alternating-current voltage Vac with a predetermined frequency is supplied to the gate electrode G of the MOS capacitive element, the alternating-current voltage Vac is transferred to the source electrode S and the drain electrode D through the MOS capacitive element, and is measured as an amplitude (alternating-current amplitude) of an alternating-current component contained in the output signal OUT, so that the capacitance Cs changing in accordance with a voltage value of the direct-current voltage Vdc at that time can be obtained.

FIG. 4B illustrates a relation between the direct-current voltage Vdc and the capacitance Cs of the MOS capacitive element configured by the sensor FET 108_s. In FIG. 4B, a horizontal axis indicates the direct-current voltage Vdc, and a vertical axis indicates an absolute value "Abs" of the capacitance Cs of the MOS capacitive element. FIG. 4B illustrates so-called characteristics between the electrostatic capacitance and the direct-current voltage (hereinafter, also referred to as "capacitance-voltage characteristics") of the MOS capacitive element. The capacitance Cs is increased by increase in the direct-current voltage Vdc.

For example, as illustrated in FIG. 2B, in comparison with the threshold value at the time of normal state, the threshold voltage of the sensor FET 108_s changes (by the voltage change ΔVth) in accordance with the gas concentration at the time of gas detection. This corresponds to a fact that the direct-current voltage Vdc supplied to the MOS capacitive element at the time of gas detection changes by a voltage change ΔVdc corresponding to the voltage change ΔVth in comparison with the direct-current voltage at the time of normal state.

In FIG. 4B, a symbol "CV1" represents the capacitance-voltage characteristics at the time of normal state, and a symbol "CV2" represents the capacitance-voltage characteristics at the time of gas detection. At the time of gas detection, a voltage value of the direct-current voltage Vdc supplied to the gate electrode G changes by the voltage change ΔVdc corresponding to the voltage change ΔVth of the threshold voltage changing in accordance with the gas concentration. Therefore, the capacitance-voltage characteristics CV2 shift along the horizontal axis Vdc while keeping a shape of the capacitance-voltage characteristics CV1.

When a state changes from the time of normal state to the time of gas detection while the direct-current voltage Vdc is kept at a voltage Vdc0 in both of the time of normal state and the time of gas detection, the capacitance Cs of the MOS capacitive element configured by the sensor FET 108_s changes from a capacitance value Cs0 to a capacitance value Cs1. A difference ΔCs between the capacitance values Cs0 and Cs1 represents a gas concentration. For example, the difference ΔCs is output as a gas concentration detection output.

On the other hand, in both of the time of normal state and the time of gas detection, the direct-current voltage Vdc supplied to the MOS capacitive element may be controlled by the feedback control so that the capacitance Cs of the MOS capacitive element keeps having the capacitance value Cs0. In this case, while the voltage value of the direct-current voltage Vdc supplied to the MOS capacitive element at the time of normal state becomes Vdc0, the voltage value of the direct-current voltage Vdc supplied to the MOS capacitive element at the time of gas detection is changed to a value Vdc1 by the feedback control. A voltage difference ΔVdc between the voltage values Vdc0 and Vdc1 represents the gas concentration. Therefore, the voltage difference ΔVdc is output as the gas concentration detection output.

As the gas sensor according to the embodiment described later, explanation will be made about an example of such an output of the gas concentration detection output as making the same capacitance Cs of the MOS capacitive element in which the time of normal state and at the time of gas detection are the same as each other. The gas sensor includes a resonant circuit with the MOS capacitive element configured by the sensor FET although described in the following embodiments. By the feedback control causing the resonant circuit in the resonance state with the same frequency in which the time of normal state and the time of gas detection are the same as each other, the capacitance value of the capacitance Cs of the MOS capacitive element is controlled so that the capacitance values at the time of normal state and the time of gas detection are the same as each other.

Figure 5A:
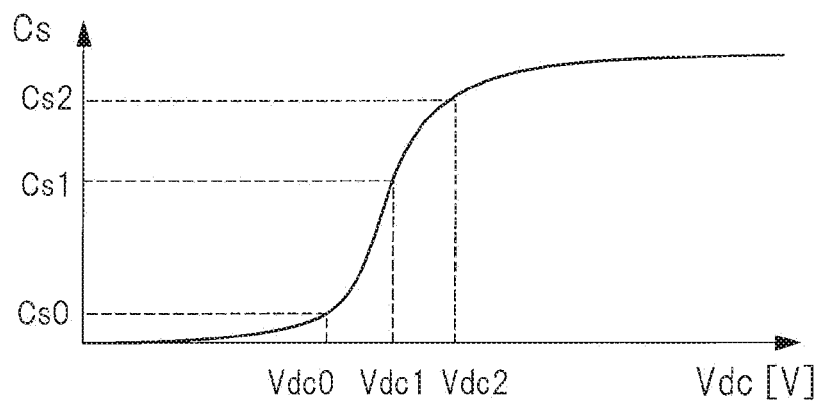
FIG. 5A is a diagram for describing a state of a resonant circuit according to the first embodiment.
Figure 5B:
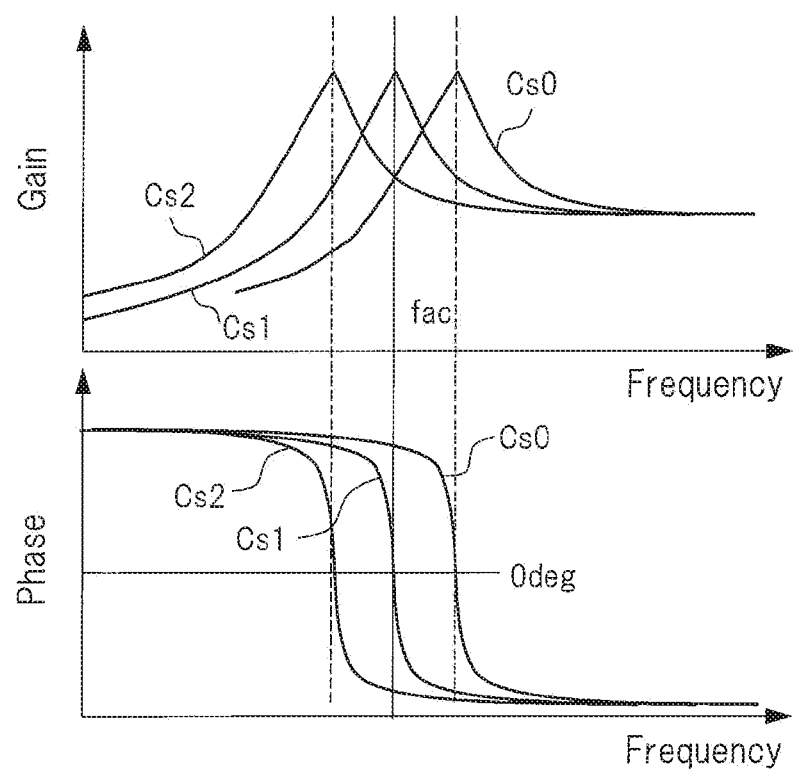
FIG. 5B is a diagram for describing the state of the resonant circuit according to the first embodiment.

Each of FIGS. 5A and 5B is a diagram for describing a state of the resonant circuit according to the first embodiment. The resonant circuit includes an inductor and the MOS capacitive element configured by the above sensor FET 108_s. Herein, description will be made about an LC (inductor and capacitance) resonant circuit formed by connecting the inductor and the MOS capacitive element in series as an example of the resonant circuit.

FIG. 5A is a diagram illustrating the capacitance-voltage characteristics of the MOS capacitive element. FIG. 5A illustrates the relation between the direct-current voltage Vdc supplied to the MOS capacitive element and the capacitance Cs of the MOS capacitive element as similar to FIG. 4B described above.

FIG. 5B is a characteristic diagram illustrating gain characteristics and phase characteristics of the resonant circuit. An upper side of FIG. 5B illustrates a gain characteristic diagram in which a horizontal axis represents a frequency and a vertical axis represents a gain. In addition, a lower side of FIG. 5B illustrates a phase characteristic diagram in which a horizontal axis represents a frequency and a vertical axis represents a phase. When the direct-current voltage Vdc has a voltage value Vdc1, the capacitance Cs of the MOS capacitive element has the capacitance value Cs1. It is assumed that the resonant frequency of the resonant circuit at this time is a frequency "fac" illustrated in the gain characteristic diagram of FIG. 5B. The gain of the resonant circuit becomes the highest at the resonant frequency. Therefore, the gain characteristics Cs1 showing the gain characteristics at the capacitance value Cs1 reaches a peak at the resonant frequency fac as illustrated in the gain characteristic diagram of FIG. 5B, and the gain is lowered at frequencies out of the resonant frequency fac.

When the voltage value of the direct-current voltage Vdc supplied to the MOS capacitive element is increased from Vdc0 to Vdc2, the capacitance Cs of the MOS capacitive element is increased from the capacitance value Cs0 to the capacitance value Cs2. In this manner, the resonant frequency of the resonant circuit shifts toward a low frequency side. This is because the resonant frequency is reversely proportional to the square root of the capacitance Cs of the MOS capacitive element. Since the resonant frequency shifts toward the low frequency side, the gain at the resonant frequency caused when the capacitance Cs has the capacitance value Cs0 reaches a peak at a higher frequency than the resonant frequency fac as illustrated with the gain characteristics Cs0 in the gain characteristic diagram of FIG.

5B. On the other hand, the gain at the resonant frequency caused when the capacitance Cs has the capacitance value Cs2 reaches a peak at a lower frequency than the resonant frequency fac as illustrated with the gain characteristics Cs2 in the gain characteristic diagram of FIG. 5B.

In addition, when the resonant circuit is in the resonance state, the phase of the resonant circuit becomes at 0 degree. When the resonant circuit is out of the resonance state, the phase of the resonant circuit shifts from 0 degree and becomes at +90 or −90 degrees. The phase characteristic diagram of FIG. 5B illustrates the phase characteristics Cs0 caused when the capacitance Cs has the capacitance value Cs0, illustrates the phase characteristics Cs1 caused when it has the capacitance value Cs1, and illustrates the phase characteristics Cs2 caused when it has the capacitance value Cs2. By monitoring the phase of the resonant circuit and detecting that the phase is either at 0 degree or out of 0 degree, it can be detected whether the resonant circuit is in the resonance state or not.

<Configuration of Gas Sensor System>

Figure 16:
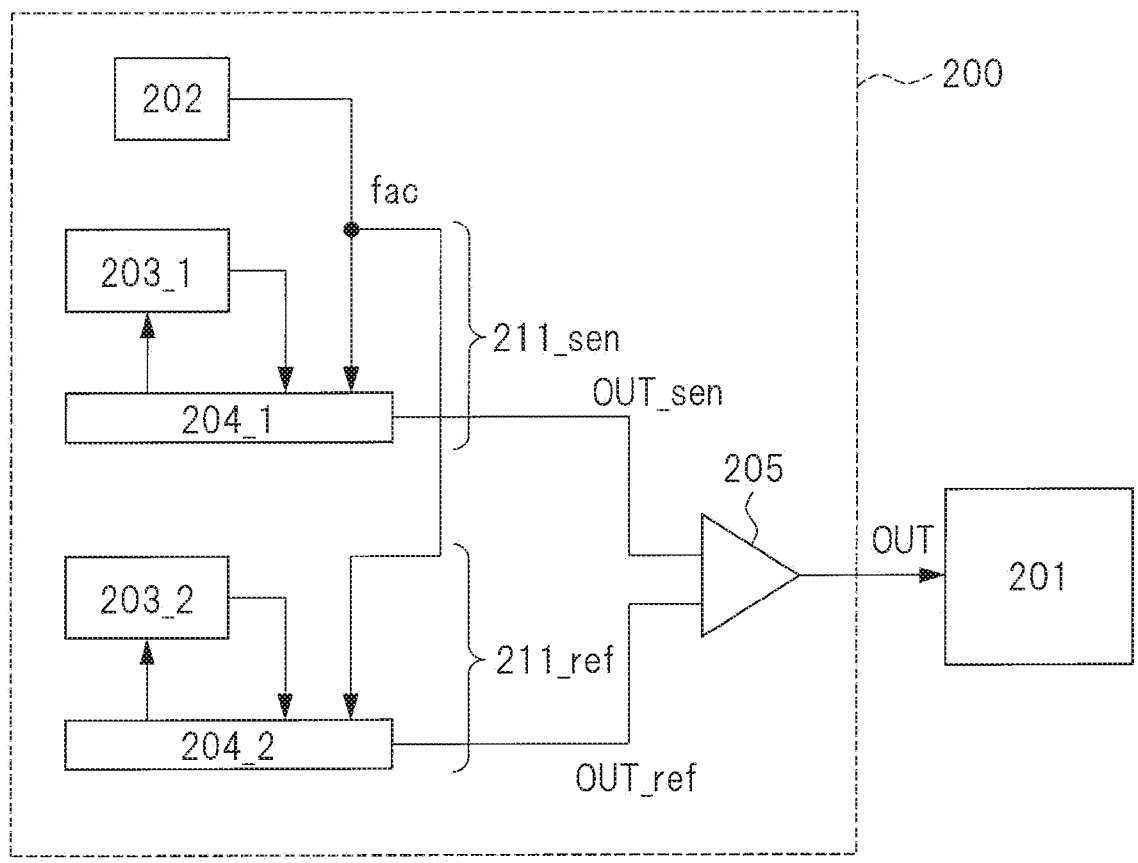
FIG. 16 is a block diagram illustrating a configuration of a gas sensor system according to the first embodiment.

FIG. 16 is a block diagram illustrating a configuration of a gas sensor system according to the first embodiment. A gas sensor system 210 includes a gas sensor 200 and an upstream system 201 to which the gas concentration detection output OUT is supplied from the gas sensor 200. The upstream system 201 is notified of the gas concentration from the gas concentration detection output OUT, and executes a process in accordance with the notified gas concentration. Although not particularly limited, the gas sensor 200 includes a detection gas sensor 211_sen, a reference gas sensor 211_ref, a standard clock (reference clock) generating circuit 202, and a differential circuit 205.

The detection gas sensor 211_sen includes a control circuit 204_1 and an element unit 203_1 which includes the sensor FET. The control circuit 204_1 detects difference in a phase between a signal from the element unit 203_1 and a standard clock (reference clock) signal "fac" from the standard clock generating circuit 202, and supplies a voltage changing in accordance with the detected phase difference and a signal changing in accordance with the standard clock signal fac to the element unit 203_1. In addition, the control circuit 204_1 outputs a gas concentration detection output OUT_sen changing in accordance with the gas concentration detected by the sensor FET.

The reference gas sensor 211_ref has a configuration as similar to that of the detection gas sensor 211_sen. A difference is that an element unit 203_2 includes the reference FET instead of the sensor FET. Although a control circuit 204_2 executes an operation that is similar to an operation of the control circuit 204_1, the control circuit 204_2 outputs a gas concentration detection output OUT_ref changing in accordance with the gas concentration detected by the reference FET instead of the sensor FET.

In the reference FET, the catalytic gate electrode is covered with the detection target blocking film 150 as described above with reference to FIGS. 1A and 1B. Therefore, even when the element unit 203_2 is in the hydrogen gas atmosphere, the element unit 203_2 outputs a signal which does not depend on the hydrogen gas. Therefore, a value of the gas concentration detection output OUT_ref does not depend on the hydrogen gas. In other words, the gas concentration detection output OUT_ref shows the concentration at the time of normal state.

On the other hand, in the sensor FET as described above with reference to FIGS. 1A and 1B, the catalytic gate electrode is not covered with the detection target blocking film 150. Therefore, even if the element unit 203_1 is placed in the hydrogen gas atmosphere, the element unit 203_1 outputs a signal depending on the hydrogen gas. Therefore, a value of the gas concentration detection output OUT_sen depends on the concentration of the hydrogen gas. In other words, the gas concentration detection output OUT_sen shows the concentration at the time of gas detection.

The gas concentration detection outputs OUT_sen and OUT_ref are input to the differential circuit 205, and the differential circuit 205 outputs the gas concentration detection output OUT that is obtained by removing in-phase components. Since the in-phase components of the gas concentration detection outputs OUT_sen and OUT_ref are removed, the gas concentration detection output OUT from which noises or others are removed is supplied to the upstream system 201. Therefore, reliability can be improved.

Next, the detection gas sensor 211_sen will be described in detail. Note that only a difference of the reference gas sensor 211_ref from the detection gas sensor 211_sen will be described.

<Configuration of Detection Gas Sensor>

Figure 6:
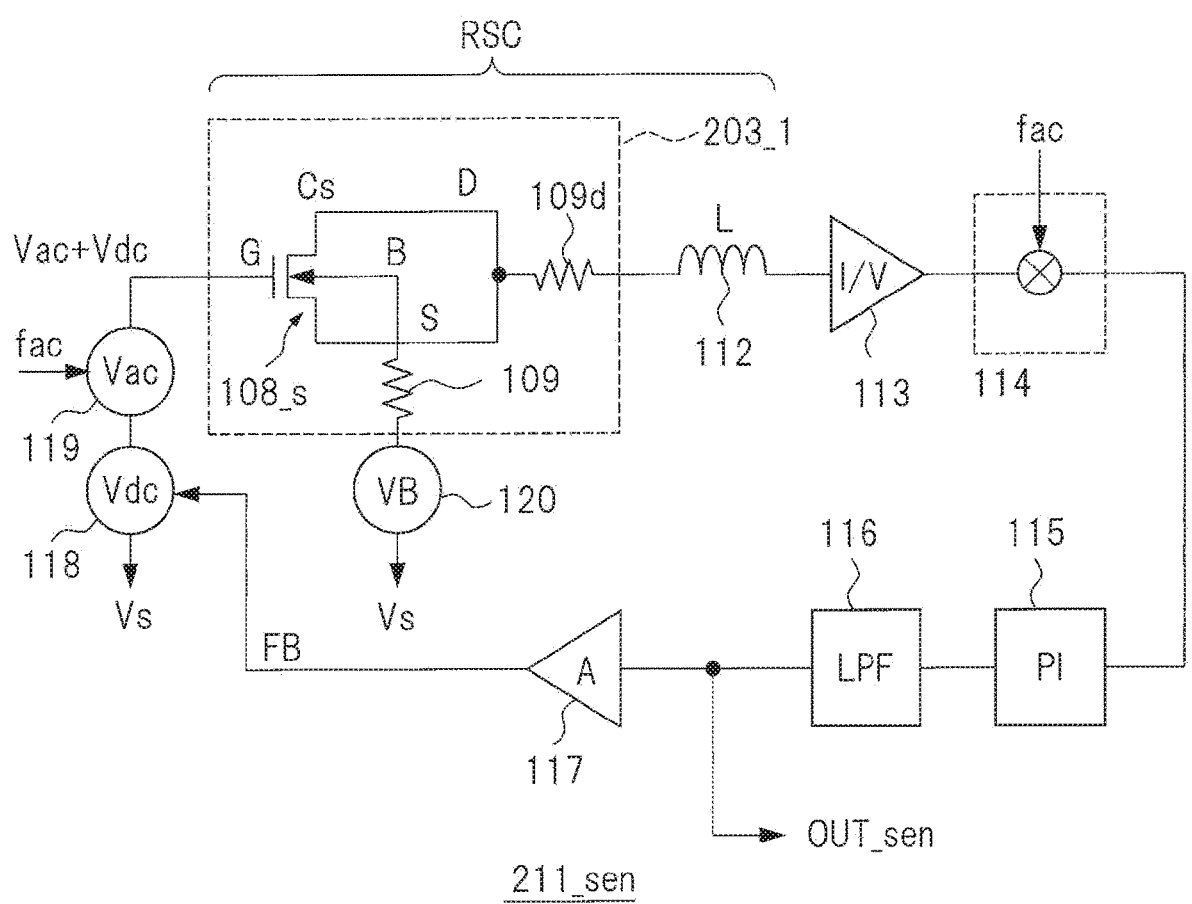
FIG. 6 is a circuit diagram illustrating a configuration of the detection gas sensor according to the first embodiment.

FIG. 6 is a circuit diagram illustrating a configuration of the detection gas sensor 211_sen according to the first embodiment. The detection gas sensor 211_sen includes the sensor FET 108_s, an inductor (L) 112, a transimpedence amplifier (I/V) 113, a phase detection circuit 114, a controller (PI) 115, a low pass filter (LPF) 116, an amplifier 117, a direct-current voltage source 118, an alternating-current voltage source 119, and a substrate direct-current voltage source 120. As a correspondence relation with respect to the detection gas sensor 211_sen illustrated in FIG. 16, the sensor FET 108 is provided in the element unit 203_1. Although not particularly limited, the inductor 112, the transimpedence amplifier 113, the phase detection circuit 114, the controller 115, the low pass filter 116, the amplifier 117, the direct-current voltage source 118, the alternating-current voltage source 119, and the substrate direct-current voltage source 120 are provided in the control circuit 204_1. Obviously, the configuration is an example, and some units of the configuration provided in the control circuit 204 may be provided in the element unit 203_1.

As described with reference to FIGS. 4A and 4B, the sensor FET 108_s configures the MOS capacitive element so that the source electrode S and the drain electrode D are connected to each other. Hereinafter, the MOS capacitive element configured by the FET is also simply referred to as the MOS capacitive element of the FET. In addition, the sensor FET 108_s includes the structure illustrated in FIG. 3A and others. Each of symbols "109" and "109d" represents the equivalent resistance element described with reference to FIGS. 4A and 4B. The equivalent resistance elements 109 and 109d equivalently show the Schottky contact, and thus, are also referred to as Schottky resistors in the following description.

The gate electrode G of the sensor FET 108_s is connected to the ground voltage Vs through the alternating-current voltage source 119 and the direct-current voltage source 118. Herein, the alternating-current voltage source 119 forms the alternating-current voltage Vac having a frequency based on the frequency (standard frequency) of the standard clock signal fac which is formed by the standard clock generating circuit 202 described in FIG. 16. For example, the alternating-current voltage Vac having the same frequency as the frequency of the standard clock signal fac is formed. In addition, the direct-current voltage source 118 forms the direct-current voltage Vdc changing in accordance with a feedback voltage FB. In this manner, the alternating-current voltage Vac which is changed by the frequency of the standard clock signal fac is superimposed on the direct-current voltage Vdc which changes in accordance with the feedback voltage FB, and is supplied to the gate electrode G of the sensor FET 108_s based on the ground voltage Vs.

The semiconductor layer forming the substrate gate electrode B of the sensor FET 108_s is connected to the substrate direct-current voltage source 120 through the Schottky resistor 109. The substrate direct-current voltage source 120 generates a direct-current substrate voltage VB based on the ground voltage Vs, and supplies the substrate voltage to the substrate gate electrode B through the Schottky resistor. In addition, the semiconductor layer forming the source terminal S and the semiconductor layer forming the drain terminal D of the sensor FET 108_s are connected to one terminal of the inductor 112 through the Schottky resistor 109d.

The other terminal of the inductor 112 is connected to the input of the transimpedence amplifier 113. The transimpedence amplifier 113 converts a current signal that is input from the other terminal of the inductor 112 into a voltage signal (I/V conversion), and outputs the voltage signal. The voltage signal output from the transimpedence amplifier 113 is supplied to the phase detection circuit 114. The phase detection circuit 114 compares phases between the standard clock signal fac formed by the standard clock generating circuit 202 and the voltage signal from the transimpedence amplifier 113, detects a phase difference, and outputs the detected phase difference.

The phase difference detected by the phase detection circuit 114 is supplied to the controller 115. The controller 115 controls the direct-current voltage Vdc formed by the direct-current voltage source 118 so that the phase difference detected by the phase detection circuit 114 is reduced or desirably becomes zero. In the first embodiment, a PI (Proportional Integral) controller is used as the controller 115. An output of a general phase detection circuit 114 is configured by a sum of the direct-current component and a harmonic component "$2fac$" which is twice the standard clock signal fac. By the low pass filter 116, the harmonic component $2fac$ that is a high frequency component is removed.

In the first embodiment, an output of the low pass filter 116 becomes the gas concentration detection output OUT_sen, and is supplied to the differential circuit 205 illustrated in FIG. 16. Therefore, it can be considered that, by the low pass filter 116, an unnecessary harmonic component is suppressed from being contained in the gas concentration detection output OUT_sen that is the output from the detection gas sensor 211_sen.

In addition, the output of the low pass filter 116 is supplied to the amplifier 117. An output of the amplifier 117 is supplied to the direct-current voltage source 118 as the feedback voltage FB. The amplifier 117 amplifies the output from the low pass filter 116 to form the feedback voltage FB, and the gain is adjusted by the amplifier 117 so that the feedback voltage is suitable for the direct-current voltage source 118.

Other circuit units except for the sensor FET 108_s and the inductor 112 can be digitalized. For example, each of the transimpedence amplifier 113, the phase detection circuit 114, the controller 115, and the low pass filter 116 can be configured by a digital circuit. In this case, the amplifier 117 is configured to have a function of converting a digital signal from the digital circuit into an analog signal.

The direct-current voltage source 118 forms the direct-current voltage Vdc changing in accordance with the supplied feedback voltage FB. Since the direct-current voltage Vdc is formed in accordance with the feedback voltage FB, the direct-current voltage source 118 can also be considered as a variable direct-current voltage source. The standard clock signal fac is supplied from the standard clock generating circuit 202 to the alternating-current voltage source 119, and the alternating-current voltage source 119 forms the alternating-current voltage Vac having the same frequency as that of the standard clock signal fac, and adds the alternating-current voltage Vac to the direct-current voltage Vdc (Vac+Vdc). The voltage "Vac+Vdc" is supplied to the gate electrode G of the sensor FET 108_s in the element unit 203_1.

In this manner, a feedback system which performs the feedback control on the direct-current voltage Vdc formed by the direct-current voltage source 118 is structured so that the phase difference detected by the phase detection circuit 114 is reduced. In other words, a feedback unit which supplies a voltage changing in accordance with the phase difference detected by the phase detection circuit 114 to the element unit 203_1 is configured by the controller 115, the low pass filter 116, an amplifier 117, the direct-current voltage source 118, and the alternating-current voltage source 119. In this case, it is desirable to provide the low pass filter 116 and the amplifier 117. However, if it is not required to consider the harmonic waves and the gain adjustment, the feedback unit may not include the low pass filter and the amplifier.

The capacitance of the MOS capacitive element configured by the sensor FET 108_s is mainly determined by the direct-current voltage Vdc which is formed by the direct-current voltage source 118. Therefore, a resonant frequency of a resonant circuit RSC configured by the sensor FET 108_s and the inductor 112 changes in accordance with the feedback voltage FB. To the resonant circuit RSC, the alternating-current signal (the alternating-current voltage Vac) having the same frequency as that of the standard clock signal fac is supplied, so that the phase difference between the standard clock signal fac and the frequency of the alternating-current signal propagating the resonant circuit RSC is obtained by the phase detection circuit 114. A capacitance value of the MOS capacitive element is changed to reduce the phase difference obtained by the phase detection circuit 114, and the resonant frequency of the resonant circuit RSC is controlled to keep the frequency of the standard clock signal fac. At this time, a signal changing in accordance with the phase difference obtained by the phase detection circuit 114 is output as the gas concentration detection output OUT_sen.

The capacitance value of the MOS capacitive element configured by the sensor FET 108_s changes in accordance with the gas concentration as described above. However, the capacitance value of the MOS capacitive element is controlled by the feedback voltage FB of the feedback control so that the resonant frequency of the resonant circuit RSC matches the frequency of the standard clock signal fac. In other words, when the capacitance value changes in accordance with the gas concentration, the feedback control is performed so that the capacitance value becomes a capacitance value matching the resonant frequency (the frequency of the standard clock signal fac), and therefore, the capacitance value changes to be a constant capacitance value. A value corresponding to the difference between the capacitance value changing in accordance with the gas concentration and the capacitance value matching the resonant frequency is output as the gas concentration detection output OUT_sen.

In the reference gas sensor 211_ref, the FET in the element unit 203_2 (FIG. 16) is changed from the sensor FET 108_s illustrated in FIG. 6 to the reference FET 108_r. The configuration of the control circuit 204_2 (FIG. 16) is the same as the configuration described with reference to FIG. 6. In the reference FET 108_r, the catalytic gate electrode is covered with the detection target blocking film 150. Therefore, even in the hydrogen gas atmosphere, the threshold voltage of the reference FET 108_r does not change, and the capacitance value of the MOS capacitive element configured by the reference FET 108_r does not change. Therefore, the feedback voltage FB in the reference gas sensor 211_ref becomes a voltage (standard voltage) to match the frequency of the standard clock signal fac with the resonant frequency of the resonant circuit RSC which is configured by the inductor 112 and the MOS capacitive element configured by the reference FET 108_r, and the voltage becomes a constant offset voltage which does not depend on the concentration of the hydrogen gas. Therefore, the gas concentration detection output OUT_ref has a value which does not depend on the concentration of the hydrogen gas.

As illustrated in FIG. 16, the differential circuit 205 obtains a difference between the gas concentration detection outputs OUT_sen and OUT_ref, and notifies the gas concentration detection output OUT to the upstream system 201. By such an operation as obtaining the difference, a common environmental factor between the sensor FET 108_s and the reference FET 108_r which is irrelevant to the gas detection such as temperature characteristics of the standard clock signal fac can be removed. Therefore, the upstream system can be notified of a highly reliable detection result of the gas concentration as the gas concentration detection output OUT.

The standard clock signal fac is formed by the standard clock generating circuit 202 as illustrated in FIG. 16. In the first embodiment, the standard clock generating circuit 202 includes a crystal oscillator, and forms the standard clock signal fac based on a frequency determined by the crystal oscillator. In the detection gas sensor 211_sen and the reference gas sensor 211_ref, the resonant frequency of the resonant circuit RSC or others is controlled so as to be synchronized with the standard clock signal fac to match the frequency of the standard clock signal fac. Since it is desirable to form the stable temperature characteristics and others in the standard clock signal supplied from the outside of the element units 203_1 and 203_2 and the control circuits 204_1 and 204_2, the standard clock signal fac is formed by using the crystal oscillator in the first embodiment.

Further, the standard clock signal fac desirably has the frequency characteristics which are calibrated with respect to a temperature. In this manner, it is not required to additionally correct the temperature for the gas concentration detection outputs OUT_sen and OUT_ref. Therefore, the cost can be reduced.

In addition, in the first embodiment, each of the detection gas sensor 211_sen and the reference gas sensor 211_ref includes the resonant circuit RSC and the phase detection circuit 114. To each phase detection circuit 114, the standard clock signal fac formed by the common standard clock generating circuit 202 is supplied. Further, the alternating-current signal supplied to each resonant circuit RSC is also based on the standard clock signal formed by the common standard clock generating circuit 202. It is considered that the temperature dependency still exists even when the frequency characteristics of the standard clock signal fac is calibrated with respect to the temperature as described above, and therefore, considered that the changes of the gas concentration detection outputs OUT_sen and OUT_ref still exist. In this case, the changes are observed as a common mode for the input of the differential circuit 205, and therefore, the changes can be removed by the differential circuit 205.

When the controller 115 is configured by a PI controller, it is desirable to, from the outside of the gas sensor 200, appropriately set a control multiplier which is multiplied to a proportional term and a control multiplier which is multiplied to an integral term. In this manner, the control multipliers can be set for each gas sensor 200, and therefore, the setting is helpful to reduce a defect rate of the gas sensor 200. In this case, a nonvolatile memory may be provided in the gas sensor system 210 or the gas sensor 200, the control multipliers may be previously set for the nonvolatile memory, and the PI controller setting for the control multipliers stored in the nonvolatile memory may be performed at the time of, for example, booting the system.

<Operation at the Time of Gas Detection>

Figure 7A:
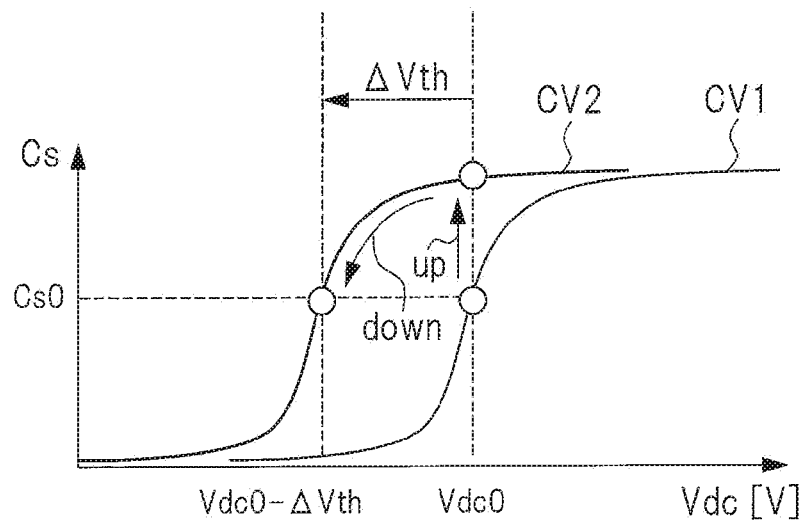
FIG. 7A is a diagram for describing that the resonant circuit of the detection gas sensor according to the first embodiment keeps a resonance state.
Figure 7B:
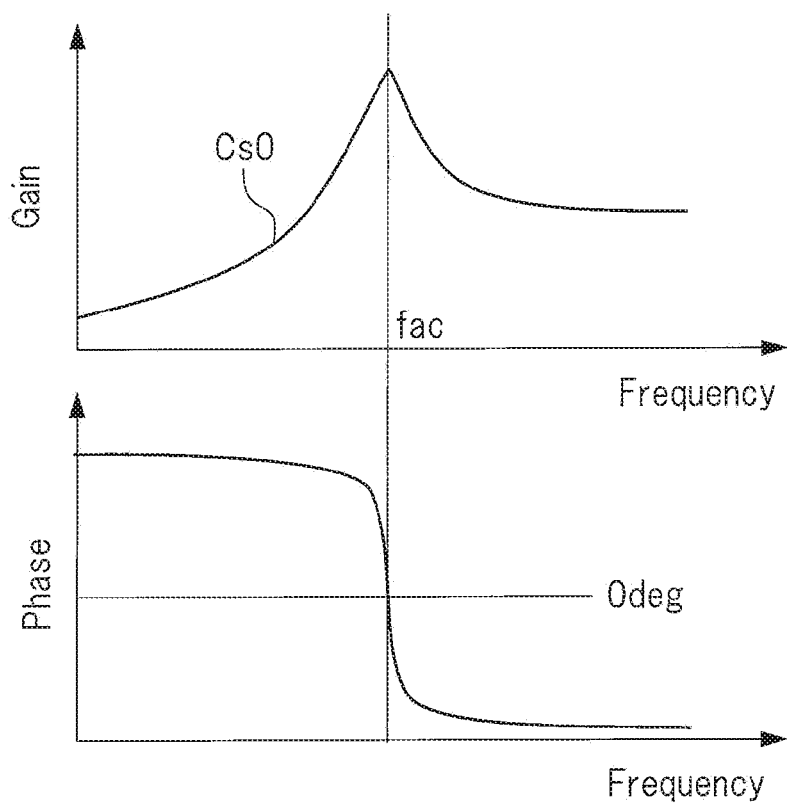
FIG. 7B is a diagram for describing that the resonant circuit of the detection gas sensor according to the first embodiment keeps the resonance state.

Next, the description will be made about a case in which the resonant circuit RSC illustrated in FIG. 6 keeps the resonance state at the time of gas detection. Each of FIGS. 7A and 7B is a diagram for describing that the resonant circuit RSC in the detection gas sensor 211_sec according to the first embodiment keeps the resonance state. FIG. 7A is a diagram illustrating the capacitance-voltage characteristics of the MOS capacitive element configured by the sensor FET 108_s as similar to FIG. 5A in which a horizontal axis indicates the voltage supplied to the MOS capacitive element and a vertical axis indicates the capacitance value of the MOS capacitive element. In addition, an upper side of FIG. 7B illustrates the gain characteristics of the resonant circuit RSC, and a lower side of the same illustrates the phase characteristics of the resonant circuit RSC as similar to FIG. 5B. A horizontal axis of FIG. 7B indicates the frequency, a vertical axis on the upper side indicates the gain, and a vertical axis on the lower side indicates the phase.

As described above with reference to FIGS. 5A and 5B, the resonant frequency of the resonant circuit configured by the MOS capacitive element and the inductor changes depending on the capacitance value of the MOS capacitive element. For example, when the capacitance Cs changes to the capacitance values Cs0, Cs1, and Cs2 as illustrated in FIG. 5A, the resonant frequency changes as illustrated in FIG. 5B. Meanwhile, the threshold voltage of the sensor FET 108_s changes in accordance with the concentration of the hydrogen gas. The degree of spread of the depletion layer of the sensor FET 108_s is changed by the direct-current voltage Vdc supplied to the gate electrode G of the sensor FET 108_s and the threshold voltage of the sensor FET 108_s. Therefore, the capacitance Cs of the MOS capacitive element configured by the sensor FET 108_s changes so as to follow the capacitance-voltage characteristics CV1 illustrated in FIG. 7A at the time of normal state, and changes so as to follow the capacitance-voltage characteristics CV2 illustrated in FIG. 7A at the time of gas detection. In other words, the capacitance-voltage characteristics shift toward the negative side along the axis of the direct-current voltage Vdc by the threshold voltage ΔVth which changes in accordance with the hydrogen gas.

It is assumed that the resonant frequency of the resonant circuit RSC configured by the MOS capacitive element and the inductor 112 becomes the frequency fac when the capacitance Cs of the MOS capacitive element configured by the sensor FET 108_s has the capacitance value Cs0 at the time of normal state as illustrated in FIGS. 7A and 7B. At this time, it is assumed that the direct-current voltage source 118 forms the voltage Vdc0 as the direct-current voltage Vdc. When the threshold voltage of the sensor FET 108_s changes at the time of gas detection by ΔVth in accordance with the concentration of the hydrogen gas, the capacitance-voltage characteristics of the MOS capacitive element changes from CV1 to CV2. At this time, when the direct-current voltage source 118 forms the voltage Vdc0, the capacitance Cs of the MOS capacitive element increases (up) to be larger than the capacitance value Cs0. In this manner, the phase difference is made between the voltage signal supplied from the resonant circuit RSC to the phase detection circuit 114 and the standard clock signal fac.

The phase difference is detected by the phase detection circuit 114. By the feedback unit, the feedback voltage FB which reduces the phase difference is formed and is supplied to the direct-current voltage source 118. The direct-current voltage source 118 changes the voltage value of the direct-current voltage Vdc in accordance with the feedback voltage FB into a value "Vdc0−ΔVth". In this manner, the capacitance Cs of the MOS capacitive element changes the capacitance value so as to decrease (down) the capacitance value to follow the capacitance-voltage characteristics CV2, and reaches the capacitance value Cs0, and therefore, the resonant frequency of the resonant circuit RSC becomes the frequency of the standard clock signal fac. In other words, the feedback unit keeps the resonance state so as to match the resonant frequency of the resonant circuit RSC to the frequency of the standard clock signal fac.

In other words, at the time of gas detection, such a direct-current voltage Vdc as cancelling the change in the capacitance value of the MOS capacitive element which changes in accordance with the gas concentration is formed by the feedback control, and is supplied to the gate electrode G of the sensor FET 108_s. In this manner, the MOS capacitive element of the sensor FET 108_s has the capacitance value Cs0 which is the same as that at the time of normal state, so that the state with such a resonant frequency as matching the frequency of the standard clock signal fac is kept. The feedback voltage FB and the phase difference detected by the phase detection circuit 114 correspond to the voltage change ΔVth of the threshold voltage which is induced in the sensor FET 108_s in accordance with the gas concentration. Therefore, the detection gas sensor 211_sen outputs the phase difference or the feedback voltage FB as the gas concentration detection output OUT_sen. In the first embodiment, the output from the controller 115 and the low pass filter 116 is output as the gas concentration detection output OUT_sen in accordance with the phase difference. However, the feedback voltage FB output from the amplifier 117 may be output as the gas concentration detection output OUT_sen.

At the time of gas detection, the feedback control is performed on the MOS capacitive element of the sensor FET 108_s by the feedback unit so that the MOS capacitive element has the capacitance value Cs0. Therefore, as illustrated in FIG. 7B, the gain of the resonant circuit RSC reaches a peak at the frequency of the standard clock signal fac. In addition, at the frequency of the standard clock signal fac, the phase of the resonant circuit RSC becomes 0 degree. In other words, the resonant circuit RSC operates so as to keep the frequency of the standard clock signal fac to be the resonant frequency.

At the time of gas detection, the ambient temperature of the detection gas sensor 211_sen becomes in a high temperature state, and a contact state between the semiconductor layer and the metal electrode in the sensor FET 108_s is degraded. Therefore, even when the Schottky resistance is generated, or/and even when the Schottky resistance is changed, a highly-reliable gas concentration detection output OUT_sen can be obtained since the capacitance value of the MOS capacitive element of the sensor FET 108_s does not depend on the Schottky resistance. In addition, in the first embodiment, the value of the MOS capacitive element of the sensor FET 108_s is controlled to be constant through the feedback control. Such a state is the same as a fact that the state of the depletion layer in the semiconductor forming the sensor FET 108_s is kept constant, and therefore, such an effect as preventing unnecessarily carrier accumulation can be expected. As a result, the gas concentration detection output OUT_sen can be stabilized in comparison with an open loop control that allows the value of the MOS capacitive element of the sensor FET 108_s to change.

Since the reliability of each gas concentration detection output from the detection gas sensor 211_sen and the reference gas sensor 211_ref can be improved and stabilized, each reliability of the gas sensor 200 and the gas sensor system 210 can be improved and stabilized.

<Structures of Sensor FET and Reference FET>

Figure 8A:
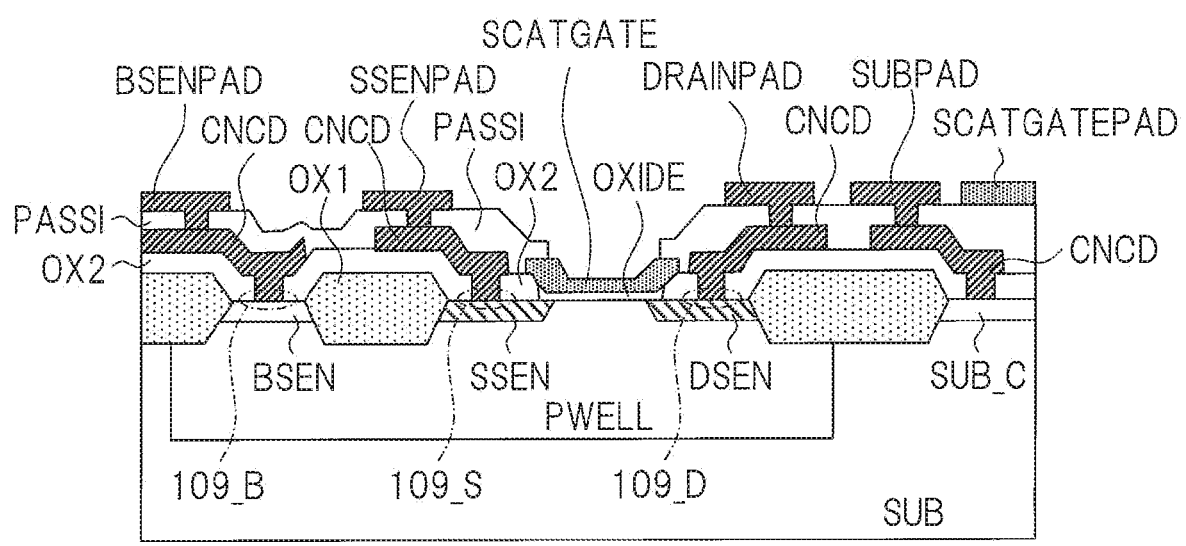
FIG. 8A is a cross-sectional view illustrating configurations of the sensor FET and the reference FET according to the first embodiment.
Figure 8B:
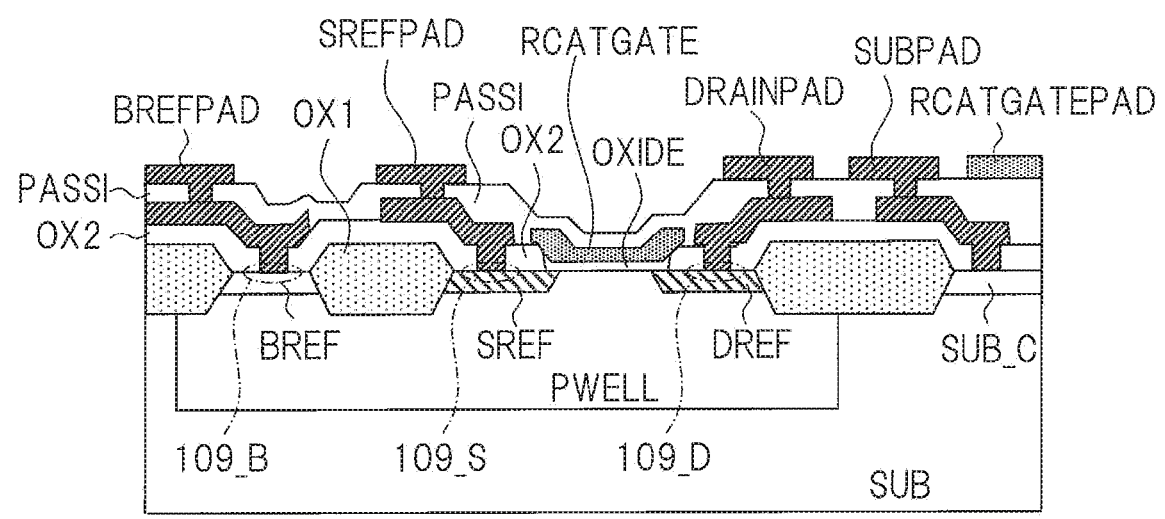
FIG. 8B is a cross-sectional view illustrating the configurations of the sensor FET and the reference FET according to the first embodiment.

Next, the structures of the sensor FET 108_s and the reference FET 108_r described above will be described. Each of FIGS. 8A and 8B is a cross-sectional view illustrating each configuration of the sensor FET and the reference FET according to the first embodiment. FIG. 8A illustrates a cross section of the sensor FET 108_s, and FIG. 8B illustrates a cross section of the reference FET 108_r. As described above, each of the sensor FET 108_s and the reference FET 108_r is an N-channel FET.

In FIGS. 8A and 8B, a symbol "SUB" represents a semiconductor substrate such as a P-type semiconductor substrate. The semiconductor substrate SUB may be a silicon substrate, or may be a silicon carbide substrate. While the P-type semiconductor substrate SUB is separately illustrated as in FIGS. 8A and 8B, the P-type semiconductor substrate SUB is continuously formed and integrated between FIGS. 8A and 8B. In the integrated P-type semiconductor substrate SUB, P-well regions "PWELL" illustrated in FIGS. 8A and 8B are formed in regions adjacent to each other. In FIGS. 1A and 1B, while the well regions are also continuously formed, the well regions PWELL are separately formed from each other in the first embodiment. In this manner, the substrate gate electrodes B of the sensor FET 108_s and the reference FET 108_r are electrically isolated from each other.

First, the sensor FET 108_s illustrated in FIG. 8A will be described. In the P-well region PWELL, a P-type semiconductor layer "BSEN", an N-type semiconductor layer "SSEN" serving as a source semiconductor layer of the sensor FET, and an N-type semiconductor layer "DSEN" serving as a drain semiconductor layer of the sensor FET are formed. In addition, a P-type semiconductor layer "SUB_C" is formed in the semiconductor substrate SUB. In addition, an element isolation film "OX1" is formed between the semiconductor layers BSEN and SSEN and between the semiconductor layers DSEN and SUB_C. In the P-well region PWELL, a catalytic gate electrode "SCATGATE" is formed on a region between the source semiconductor layer SSEN and the drain semiconductor layer DSEN through a gate oxide film "OXIDE". The catalytic gate electrode SCATGATE is, for example, a Pt—Ti—O (platinum-titanium-oxide) laminated film or a Pd (palladium) film.

The source semiconductor layer SSEN is connected to a metal wiring layer (for example, an aluminum wiring layer) "CNCD" through a through hole formed in an insulating inter-layer film OX2. Further, the metal wiring layer CNCD is connected to a source pad SSENPAD through a through hole formed in a blocking film PASSI. Although not particularly limited, the source electrode is configured by the source pad SSENPAD and the metal wiring layer CNCD. The contact portion between the metal wiring layer CNCD and the source semiconductor layer SSEN is denoted with a symbol "109_S", and forms the Schottky contact under the high temperature environment.

As similar to the source semiconductor layer SSEN, the drain semiconductor layer DSEN is also connected to the metal wiring layer CNCD through a through hole formed in the insulating inter-layer film OX2. Further, the metal wiring layer CNCD is connected to a drain pad "DRAINPAD" through a through hole formed in the blocking film PASSI. The drain electrode is configured by the drain pad DRAINPAD and the metal wiring layer CNCD. The contact portion between the metal wiring layer CNCD and the drain semiconductor layer DSEN is denoted with a symbol "109_D", and forms the Schottky contact under the high temperature environment.

In addition, the semiconductor layer BSEN is also connected to the metal wiring layer CNCD through the through hole formed in the insulating inter-layer film OX2. Further, the metal wiring layer CNCD is connected to a body pad "BSENPAD" through the through hole formed in the blocking film PASSI. The substrate gate electrode is configured by the body pad BSENPAD and the metal wiring layer CNCD. The contact portion between the metal wiring layer CNCD and the semiconductor layer BSEN is denoted with a symbol "109_B", and forms the Schottky contact under the high temperature environment.

Note that the catalytic gate electrode SCATGATE is connected to a gate pad "SCATGATEPAD", and the semiconductor substrate SUB is connected to a substrate potential pad "SUBPAD". The gate electrode of the sensor FET 108_s may be considered to be configured by the catalytic gate electrode SCATGATE and the gate pad SCATGAPAD.

The voltage "Vac+Vdc" illustrated in FIG. 6 is supplied to the gate pad SCATGATEPAD illustrated in FIG. 8A. In addition, the drain pad DRAINPAD and the source pad SSENPAD are connected to each other and are connected to one terminal of the inductor 112, and the body pad BSENPAD is connected to the substrate direct-current voltage source 120. In this manner, under the high temperature environment, the Schottky resistor 109d is connected between the inductor 112 and the drain semiconductor layer DSEN/the source semiconductor layer SSEN as illustrated in FIG. 6. In addition, the Schottky resistor 109 is connected between the semiconductor layer BSEN forming the substrate gate electrode and the substrate direct-current voltage source 120.

The configuration of the reference FET 108_r illustrated in FIG. 8B is also similar to that of the sensor FET 108_s. The catalytic gate electrode of the reference FET 108_r is denoted with a symbol "RCATGATE", the source semiconductor layer of the same is denoted with a symbol "SREF", the drain semiconductor layer of the same is denoted with a symbol "DREF", and the semiconductor layer of the same formed in the well region is denoted with a symbol "BREF". In addition, a source pad of the reference FET 108_r is denoted with a symbol "SREFPAD", the drain pad of the same is denoted with a symbol "DRAINPAD", a body pad of the same is denoted with a symbol "BREFPAD", and a gate pad of the same is denoted with a symbol "RCATGATEPAD".

In the sensor FET 108_s, a through hole is formed in the blocking film PASSI on the catalytic gate electrode SCATGATE so that the catalytic gate electrode SCATGATE is exposed. On the other hand, in the reference FET 108_r, the through hole is not formed in the blocking film PASSI on the catalytic gate electrode RCATGATE so that the catalytic gate electrode RCATGATE is covered with the blocking film PASSI. The blocking film PASSI corresponds to the detection target blocking film 150, and the catalytic gate electrode RCATGATE of the reference FET 108_r does not show the catalytic action with respect to hydrogen.

Also in the reference FET 108_r, as similar to the sensor FET 108_s, the voltage "Vac+Vdc" is supplied to the gate pad RCATGATEPAD, the drain pad DRAINPAD and the source pad SREFPAD are connected to each other and are connected to one terminal of the inductor, and the body pad BREFPAD is connected to the substrate direct-current voltage source 120.

Second Embodiment

Figure 9:
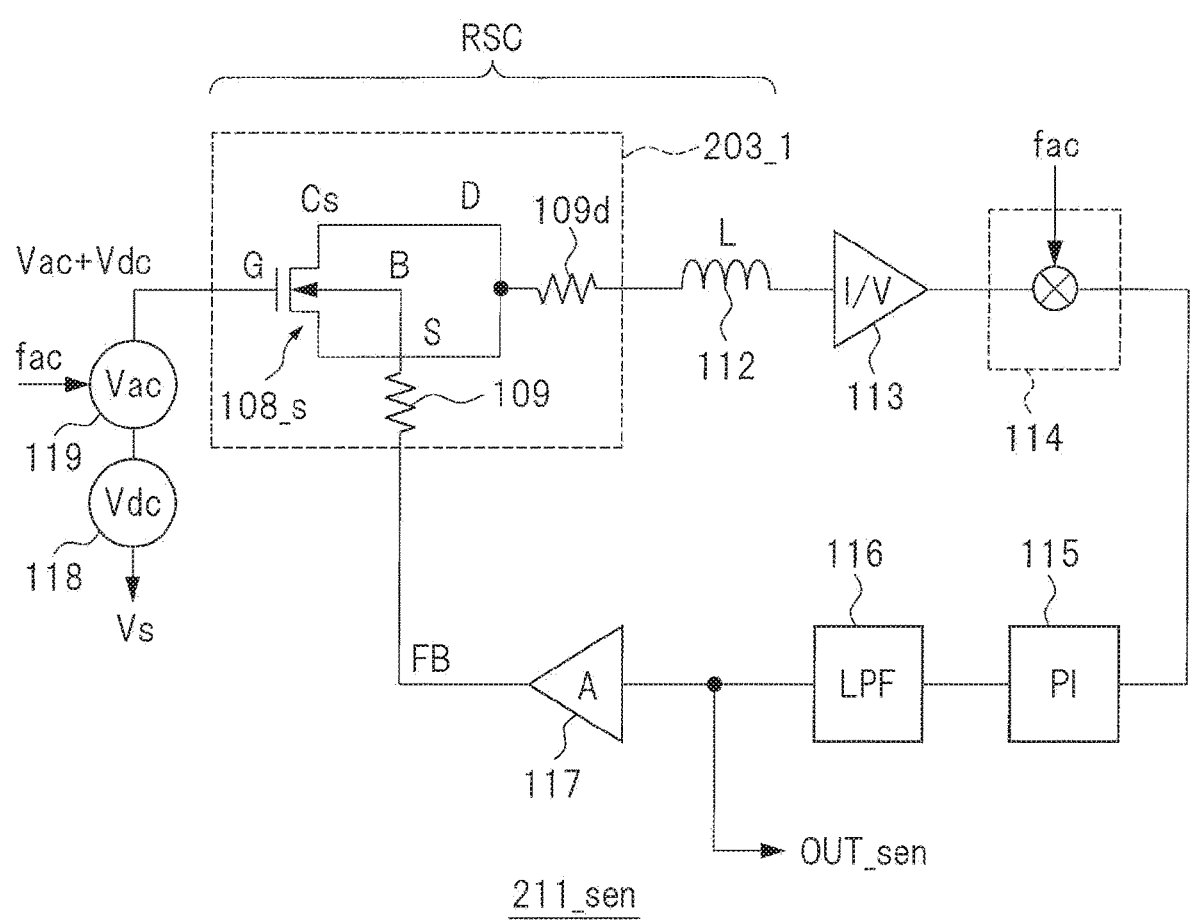
FIG. 9 is a circuit diagram illustrating a configuration of a detection gas sensor according to a second embodiment.

FIG. 9 is a circuit diagram illustrating a configuration of a detection gas sensor 211_sen according to a second embodiment. FIG. 9 will be described in differences because of being similar to FIG. 6. In FIG. 6, the feedback voltage FB is supplied to the direct-current voltage source 118, and the direct-current substrate voltage VB is supplied to the substrate gate electrode B through the Schottky resistor 109. On the other hand, in FIG. 9, the feedback voltage FB instead of the substrate voltage VB is supplied to the substrate gate electrode B through the Schottky resistor 109, and the direct-current voltage source 118 forms the direct-current voltage Vdc. In this case, the direct-current voltage source 118 forms a predetermined fixed (constant) direct-current voltage Vdc.

In this manner, in the second embodiment, a voltage of the gate electrode G of the sensor FET 108_s is kept to the constantly-fixed direct-current voltage Vdc, and becomes the voltage (Vac+Vdc) obtained by superimposing the alternating-current voltage Vac on the direct-current voltage Vdc. On the other hand, to the substrate gate electrode B of the sensor FET 108_s, the feedback voltage FB changing in accordance with the concentration of the hydrogen gas is supplied. In other words, the feedback voltage FB is supplied to the semiconductor layer (the semiconductor layer BSEN and the well region PWELL of FIG. 8A) forming the substrate gate electrode B through the Schottky resistor 109. Even when the direct-current voltage Vdc supplied to the gate electrode G is kept at a constant voltage value, the spread of the depletion layer is changed by changing the direct-current voltage supplied to the well region PWELL. In the second embodiment, the voltage of the well region PWELL is changed by the feedback voltage FB so as to cancel the change of the capacitance Cs of the MOS capacitive element of the sensor FET 108_s in accordance with the gas concentration.

In other words, in the first embodiment, the constantly-fixed substrate voltage VB is supplied to the well region PWELL through the Schottky resistor 109. However, in the second embodiment, the feedback voltage FB changing in accordance with the gas concentration is supplied to the well region PWELL. In addition, the gas concentration detection output OUT_sen is based on the output from the controller 115 as similar to the first embodiment. In other words, the gas concentration detection output OUT_sen is based on a signal which is a base of the feedback voltage FB.

Figure 10A:
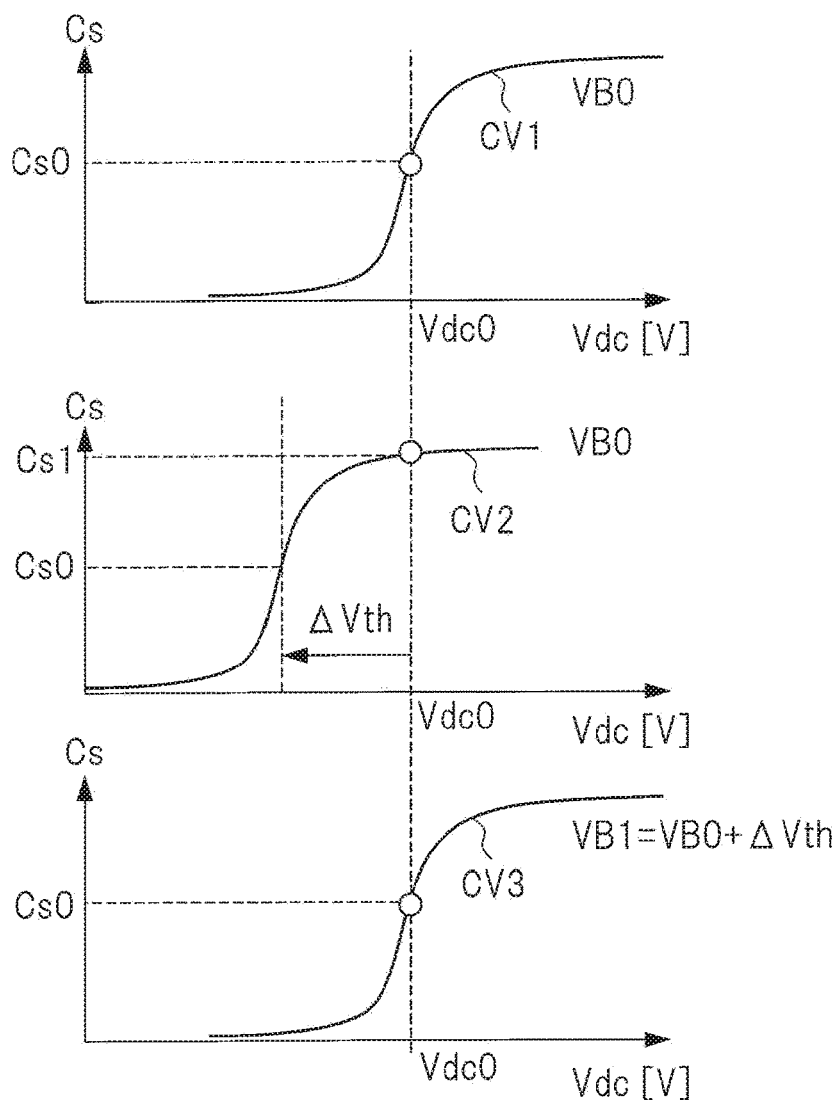
FIG. 10A is a diagram for describing an operation principle of the detection gas sensor according to the second embodiment.
Figure 10B:
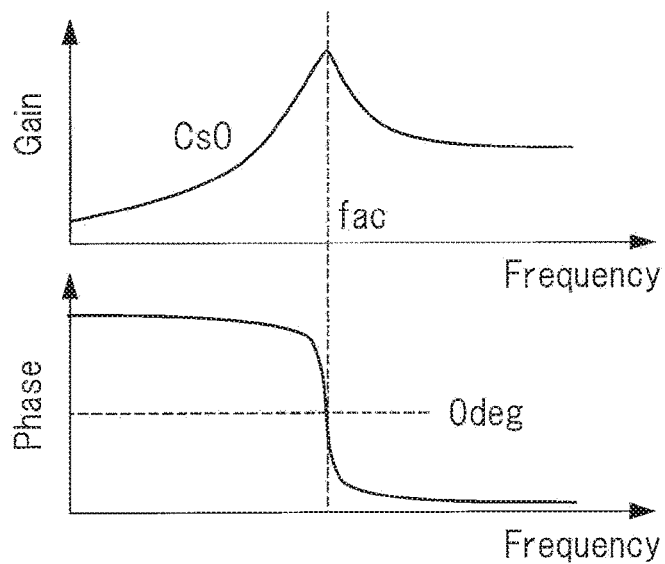
FIG. 10B is a diagram for describing the operation principle of the detection gas sensor according to the second embodiment.

Each of FIGS. 10A and 10B is a diagram for describing an operation principle of the detection gas sensor 211_sen according to the second embodiment. FIG. 10A illustrates the capacitance-voltage characteristics of the MOS capacitive element configured by the sensor FET 108_s as similar to FIG. 7, and FIG. 10B illustrates the gain characteristics and the phase characteristics of the resonant circuit RSC configured by the MOS capacitive element of the sensor FET 108_s and the inductor 112 as similar to FIG. 7B.

In FIG. 10A, three capacitance-voltage characteristics are illustrated. The top capacitance-voltage characteristics CV1 indicate the characteristics at the time of normal state, and the second capacitance-voltage characteristics CV2 indicate the characteristics at the time of gas detection. The bottom capacitance-voltage characteristics CV3 (=CV1) indicate the characteristics which have been changed by the feedback control at the time of gas detection. In both of the time of normal state and the time of gas detection, the direct-current voltage Vdc formed by the direct-current voltage source 118 is kept at a constant voltage value Vdc0. At the time of normal state, a voltage value of the feedback voltage FB becomes VB0. At the time of normal state, the capacitance Cs of the MOS capacitive element becomes Cs0. The resonant frequency of the resonant circuit RSC is the same as the frequency of the standard clock signal fac.

When the gas is detected, the threshold voltage of the sensor FET 108_s changes by ΔVth in accordance with the gas concentration. When the threshold voltage changes by ΔVth, the capacitance-voltage characteristics of the MOS capacitive element change from CV1 to CV2. In other words, the capacitance-voltage characteristics of the MOS capacitive element shift along the horizontal axis Vdc as illustrated in FIG. 10A. Since the voltage value of the direct-current voltage Vdc supplied to the gate electrode G is kept at Vdc0, the capacitance Cs of the MOS capacitive element increases from the capacitance value Cs0 to the capacitance value Cs1. Accordingly, the resonant frequency of the resonant circuit RSC tends to shift to a frequency lower than the frequency of the standard clock signal fac, and therefore, the phase difference is detected by the phase detection circuit 114. The controller 115 performs the feedback control so that the phase difference becomes zero. In other words, the controller 115 performs the feedback control so that the capacitance-voltage characteristics CV2 at the time of gas detection returns to the capacitance-voltage characteristics CV1 at the time of normal state.

By the feedback control, the voltage value of the feedback voltage FB supplied to the well region PWELL changes from VB0 to VB1, so that the capacitance-voltage characteristics become CV3. The capacitance-voltage characteristics CV3 are the same as the capacitance-voltage characteristics CV1 at the time of normal state. In this manner, the capacitance value of the MOS capacitive element of the sensor FET 108_s becomes Cs0, and the resonant frequency of the resonant circuit RSC becomes equal to the frequency of the standard clock signal fac. In other words, by the feedback control, the resonant frequency of the resonant circuit RSC is kept to be the same frequency as the frequency of the standard clock signal fac. At the time of normal state, when the voltage value of the feedback voltage FB supplied to the well region PWELL becomes VB0, the voltage value VB1 of the feedback voltage FB formed by the feedback control at the time of gas detection becomes a voltage value (VB1=VB0+ΔVth) which is a sum of the voltage value VB0 and the voltage change ΔVth of the threshold voltage in accordance with the gas concentration. Therefore, a change amount ΔVB (ΔVB=VB1−VB0) of the feedback voltage FB can be output as the voltage change ΔVth of the threshold voltage, so that the gas concentration detection output OUT_sen can be output in accordance with the gas concentration.

As illustrated in FIG. 10B, the gain of the resonant circuit RSC configured by the MOS capacitive element of the sensor FET 108_s and the inductor 112 reaches a peak at the frequency of the standard clock signal fac, and the phase becomes 0 degree. Therefore, the frequency of the standard clock signal fac is kept as the resonant frequency.

While the description has been made while exemplifying the detection gas sensor 211_sen, the reference gas sensor 211_ref is also configured as similar to the detection gas sensor 211_sen. In other words, the fixed direct-current voltage Vdc is supplied to the gate electrode G of the reference FET 108_r, and the feedback voltage FB is supplied to the substrate gate electrode B.

Third Embodiment

Figure 11A:
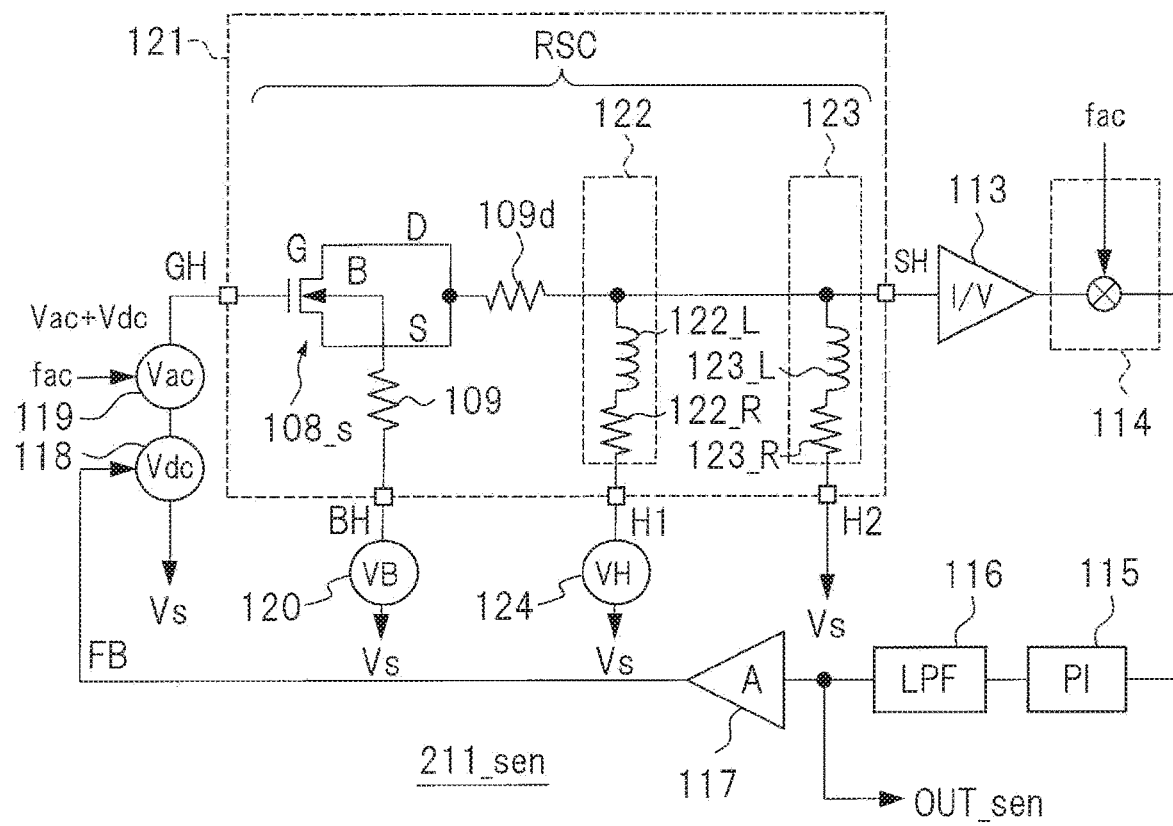
FIG. 11A is a diagram illustrating a configuration of a detection gas sensor according to a third embodiment.
Figure 11B:
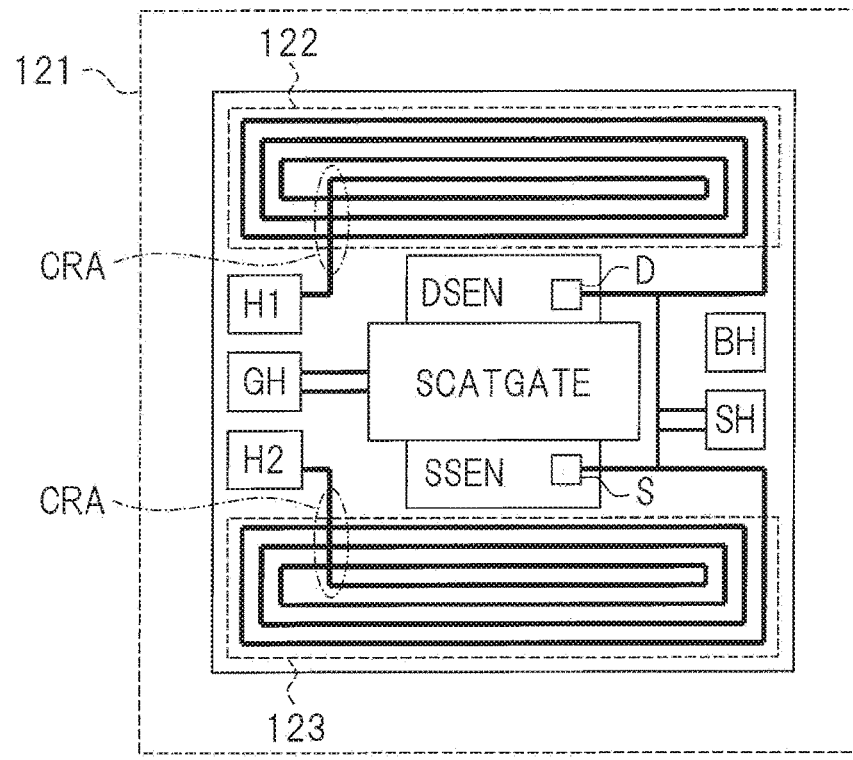
FIG. 11B is a diagram illustrating the configuration of the detection gas sensor according to a third embodiment.

Each of FIGS. 11A and 11B is a diagram illustrating a configuration of a detection gas sensor according to a third embodiment. Herein, FIG. 11A is a circuit diagram illustrating a configuration of the detection gas sensor 211_sen. In addition, FIG. 11B is a plan view of a semiconductor device which is used in the detection gas sensor 211_sen. Since FIG. 11A is similar to FIG. 6, differences will be mainly described.

In FIG. 11A, a symbol "121" represents the semiconductor device (hereinafter, also referred to as "chip") which is used in the detection gas sensor 211_sen. In the third embodiment, the sensor FET 108_s and the inductor are formed on one common chip. In the drawing, symbols "GH", "BH", "SH", "H1", and "H2" represent terminals of a chip 121. Note that the Schottky resistors 109 and 109d accompanying the bonding between the semiconductor layer and the metal electrode, and thus, the Schottky resistors 109 and 109d are illustrated so as to be included in the chip 121 in FIG. 11A.

The gate electrode G of the sensor FET 108_s is connected to the terminal GH of the chip 121, the substrate gate electrode B is connected to the terminal BH of the chip 121, and the drain electrode D and the source electrode S are connected to each other and connected to the terminal SH of the chip 121. When the connections are described in consideration of the Schottky resistors 109 and 109d, the well region forming the substrate gate electrode B is connected to the terminal BH through the Schottky resistor 109, and the drain semiconductor layer forming the drain terminal and the source semiconductor layer forming the source terminal are connected to the terminal SH through the Schottky resistor 109d. The voltage "Vac+Vdc" is supplied to the gate electrode G through the terminal GH as similar to FIG. 6, and the substrate voltage VB is supplied to the well region forming the substrate gate electrode B through the terminal BH and the Schottky resistor 109.

In the third embodiment, a heater wire is formed in the chip 121, and the chip 121 is configured to be heated by the heat of the heater wire and raise its temperature to a high temperature. The temperature of the chip 121 becomes high, so that catalytic action can be more activated by the catalytic gate electrode of the sensor FET 108_s. In the third embodiment, the heater wire formed in the chip 121 is configured by two heater wires 122 and 123. One terminal of the heater wire (first heater wire) 122 is connected to a terminal SH, and the other terminal is connected to a terminal (first terminal) H1. In addition, one terminal of the heater wire (second heater wire) 123 is also connected to the terminal SH, and the other terminal is connected to a terminal (second terminal) H2. The terminal H2 of the chip 121 is connected to the ground voltage Vs, and a heater (temperature-raising) direct-current voltage source 124 is connected between the terminal H1 and the ground voltage Vs. A direct-current voltage VH formed by the heater direct-current voltage source 124 is supplied to the terminal H1, and a direct-current current flows to the ground voltage Vs through the heater wires 122 and 123, so that the heater wires 122 and 123 are heated, and the chip 121 is heated, and the temperature increases.

Generally, it is difficult to form the inductor with a small area on the chip 121. In the third embodiment, inductor components of the heater wires 122 and 123 are used as a resonance inductor forming the resonant circuit RSC. In the drawing, symbols "122_L" and "123_L" represent inductor components of the heater wires 122 and 123. In addition, symbols "122_R" and "123_R" represent resistance components of the heater wires 122 and 123, and the heat is mainly generated by causing a direct current to flow the resistance components 122_R and 123_R. The heater wire 122 is configured by the inductor component 122_L and the resistance component 122_R which are connected in series between the terminal SH and the terminal H1. Similarly, the heater wire 123 is configured by the inductor component 123_L and the resistance component 123_R which are connected in series between the terminal SH and the terminal H2.

Since the MOS capacitive element is configured by the sensor FET 108_s, the direct-current voltage Vdc of the voltage "Vac+Vdc" supplied to the gate electrode G is not transferred to the terminal SH. However, the heater direct-current voltage VH is divided by the heater wires 122 and 123, and the divided voltage is supplied to the terminal SH. Therefore, a waveform of a signal output from the terminal SH to the transimpedence amplifier 113 includes an alternating-current signal component based on the alternating-current voltage Vac and a direct-current voltage component (divided voltage). Although not illustrated in FIGS. 11A and 11B, a capacitive element for cutting direct-current components (a direct-current-component cutting capacitive element) is connected between the terminal SH and the input of the transimpedence amplifier 113 in order to remove the direct-current voltage component.

In addition, a voltage value of the direct-current voltage Vdc formed by the direct-current voltage source 118 is determined in consideration of the above-described divided voltage. For example, when the direct-current voltage source 118 illustrated in FIGS. 11A and 11B forms the same voltage value as that of the direct-current voltage source 118 illustrated in FIG. 6, the voltage supplied to the MOS capacitive element becomes small by an amount corresponding to the divided voltage. For example, when the divided voltage is the half (VH/2) of the direct-current voltage VH, the voltage supplied to the MOS capacitive element becomes small by the voltage (HV/2). In the third embodiment, the direct-current voltage source 118 forms the direct-current voltage Vdc which changes in accordance with the feedback voltage FB so as to contain the voltage (HV/2) as a fixed offset voltage. The direct-current voltage source 118 according to the third embodiment forms the direct-current voltage Vdc which is higher by the voltage (HV/2) than that of the first embodiment.

In FIG. 11B, a symbol "SCATGATE" represents the catalytic gate electrode of the sensor FET 108_s, a symbol "DSEN" represents the drain semiconductor layer, and a symbol "SSEN" represents the source semiconductor layer. In addition, symbols "GH", "BH", "SH", "H1", and "H2" represent the terminals, and are formed in the chip 121. Each of the heater wires 122 and 123 is configured by a metal wiring layer formed in a spiral shape on the chip in a plan view.

It is desirable to arrange the heater wires 122 and 123 so as to have the inductor components 122_L and 123_L which are the same as each other and the resistance components 122_R and 123_R which are the same as each other. In addition, in order to improve a heating effect of the chip 121 and to achieve a low power consumption, it is desirable to arrange the heater wires 122 and 123 so as to cover the entire chip 121. Each material of the metal wiring layers forming the heater wires 122 and 123 is determined by a target temperature of the chip 121 and a voltage value which is applicable the heater wire. In a case of a high temperature environment such as 500° C., platinum (Pt) is considered as the material of each metal wiring layer.

If it is only required to heat the chip 121 by the heater wires 122 and 123, each of the heater wires 122 and 123 can be formed by a linear metal wiring layer in a plan view. In the third embodiment, each inductor component of the heater wires 122 and 123 is actively used as a resonance inductor. Therefore, each of the heater wires 122 and 123 is formed in the spiral shape as illustrated in FIG. 11B so as to form each inductor component. When the metal wiring layer is arranged in the spiral shape in a plan view, the metal wiring layer crosses in, for example, a region CRA illustrated in FIG. 11B. In the third embodiment, in the region CRA, one of the crossing wirings is formed of a diffusion layer (semiconductor layer) formed in the chip 121 or others. This manner can form the heater wires 122 and 123 in which the inductor components can be actively used while preventing the number of the metal wiring layers from increasing to two.

In the third embodiment, the resonant circuit RSC is configured by the MOS capacitive element of the sensor FET 108_s and the inductor components 122_L and 123_L. When the capacitance value of the MOS capacitive element of the sensor FET 108_s changes in accordance with the gas concentration, the resonant frequency of the resonant circuit RSC changes from the frequency of the standard clock signal fac. In this manner, the frequency of the alternating-current signal output from the terminal SH changes, the phase difference is detected by the phase detection circuit 114, and the feedback voltage FB is changed by the feedback control as similar to the first embodiment. In addition, the gas concentration detection output OUT_sen changing in accordance with the phase difference is output. According to the third embodiment, the temperature is increased by the heater wires, and therefore, the catalytic action can be activated. Further, each inductor component of the heater wires is used as the resonance inductor, and therefore, downsizing can be achieved.

While the detection gas sensor 211_sen has been described as an example, the reference gas sensor 211_ref is also configured as similar to FIG. 11A. In this case, for the reference FET 108_r and the heater wires, a chip having the same configuration as the configuration illustrated in FIG. 11B may be separately prepared. Alternatively, the reference FET 108_r and the heater wires may be formed on the chip 121 illustrated in FIG. 11B. For example, on one chip, two chips 121 as illustrated in FIG. 11B may be arranged. In this case, such a layout as sharing the inductor between the sensor FET 108_s and the reference FET 108_r is also applicable.

In addition, FIGS. 11A and 11B have illustrated the example of the supply of the feedback voltage FB to the direct-current voltage source 118. However, as described in the second embodiment, the feedback voltage FB may be supplied to the substrate gate electrode B. Even in this case, the feedback voltage FB supplied to the substrate gate electrode B desirably contains the fixed offset voltage in consideration of the direct-current voltage (divided voltage) at the terminal SH.

In the third embodiment, the chip 121 is considered as the element unit. When the element units 203_1 and 203_2 illustrated in FIG. 16 are configured by different chips from each other, the sensor FET 108_s and the heater wires 122 and 123 illustrated in FIG. 11A are formed on the chip 121 related to the element unit 203_1. On the other hand, on the chip 121 related to the element unit 203_2, the reference FET 108_r and the heater wires (122 and 123) for this chip are formed. In addition, when the element unit 203_1 and 203_2 are formed on one chip, the sensor FET 108_s, the reference FET 108_r, and the heater wires 122 and 123 are formed on this chip.

The semiconductor substrate forming the chip may be a silicon substrate or a silicon carbide substrate, and the sensor FET 108_s, the reference FET 108_r, and the heater wires 122 and 123 are formed on the silicon substrate or the silicon carbide substrate.

Fourth Embodiment

Figure 12:
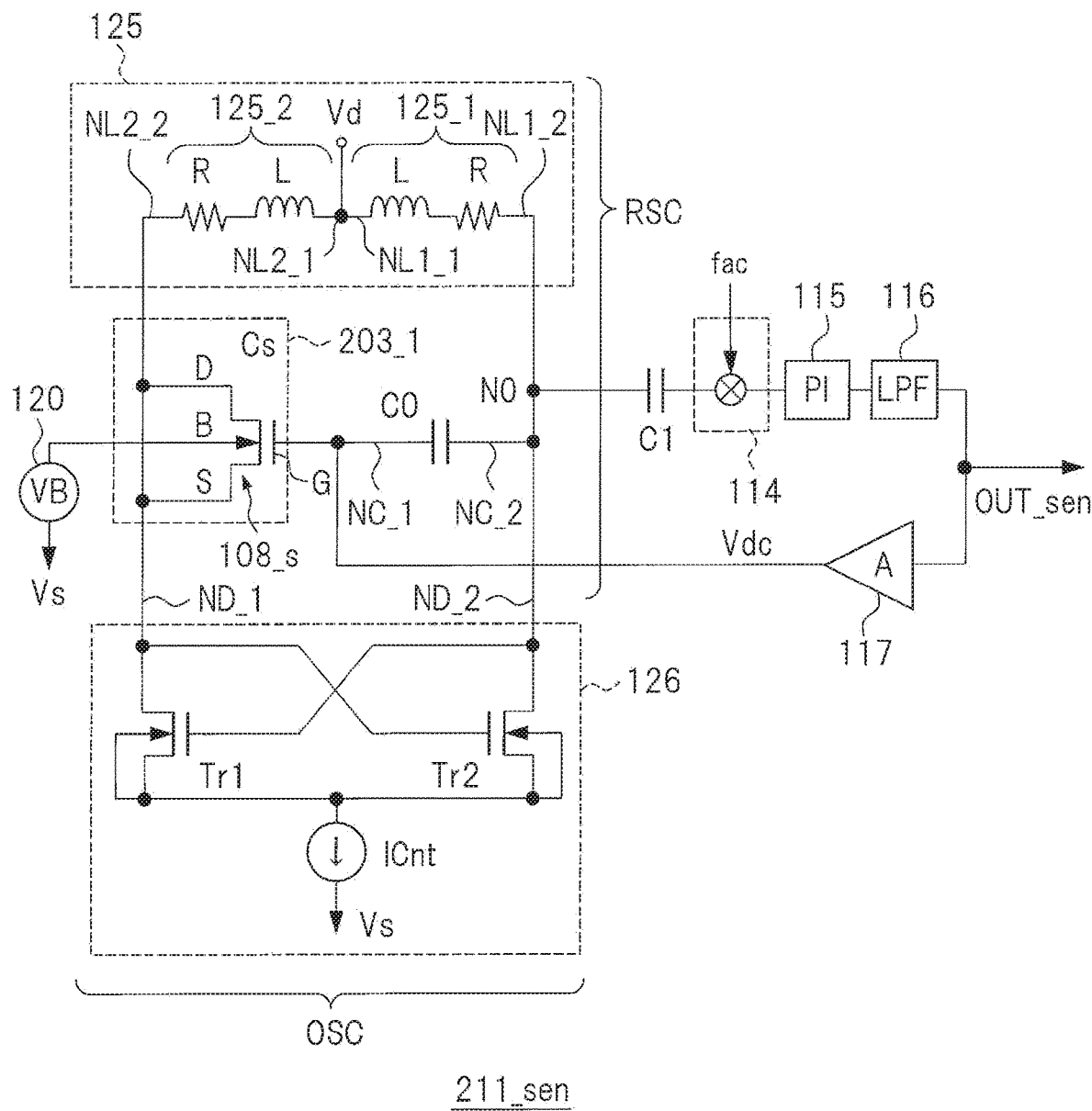
FIG. 12 is a circuit diagram illustrating a configuration of a detection gas sensor according to a fourth embodiment.

FIG. 12 is a circuit diagram illustrating a configuration of a detection gas sensor according to a fourth embodiment. In the first to third embodiments, the resonant circuit RSC is configured by the MOS capacitive element of the sensor FET 108_s and the inductor, and the gas concentration detection output OUT_sen based on the phase difference between the standard clock signal fac and the alternating-current voltage signal propagating through the resonant circuit RSC is output. Therefore, the alternating-current voltage source 119 which forms the alternating-current voltage signal supplied to the resonant circuit RSC is provided.

On the other hand, in the detection gas sensor according to the fourth embodiment, an oscillation circuit using the resonant circuit RSC which is configured by the MOS capacitive element of the sensor FET 108_s and the inductor is provided, a phase difference between an oscillating frequency of the oscillation circuit and the standard clock signal fac is detected, and the gas concentration detection output OUT_sen based on the phase difference is output. In this case, the feedback control on the capacitance value of the MOS capacitive element is performed in accordance with the detected phase difference so that the resonant frequency of the resonant circuit RSC matches the frequency of the standard clock signal fac.

The detection gas sensor 211_sen includes an oscillation circuit "OSC", a capacitive element "C1" for cutting the direct-current component which is connected to an output (oscillation) node "N0" of the oscillation circuit OSC to remove the direct-current voltage component, the phase detection circuit 114, the controller 115, the low pass filter 116, and the amplifier 117. An oscillating signal which is an output from the output node NO of the oscillation circuit OSC is supplied to the phase detection circuit 114 through the capacitive element C1 for cutting the direct-current component. The phase detection circuit 114 detects the phase difference between the standard clock signal fac and the oscillating signal, and outputs a signal, which is obtained in accordance with the phase difference, to the controller 115. The output of the controller 115 is supplied to the low pass filter 116, and the output of the low pass filter 116 is output as the gas concentration detection output OUT_sen and supplied to the amplifier 117. The amplifier 117 supplies the direct-current voltage Vdc, which is obtained in accordance with the output of the low pass filter 116, to the oscillation circuit OSC. The phase detection circuit 114, the controller 115, the low pass filter 116, and the amplifier 117 have been described in the first to third embodiments, and the further description thereof will be omitted.

The oscillation circuit OSC includes the resonant circuit RSC and a drive circuit 126 which is connected to the resonant circuit RSC. The resonant circuit RSC includes the resonating inductor 125 and a resonating capacitive element. The resonating capacitive element includes the MOS capacitive element configured by the sensor FET 108_s and a capacitive element C0 which is connected to the MOS capacitive element in series. As similar to the first to third embodiments, the drain electrode D and the source electrode S of the sensor FET 108_s are connected to each other, and the MOS capacitive element is configured to have the drain electrode D/the source electrode S as electrodes which are commonly connected to the gate electrode G of the sensor FET 108_s. In addition, to the substrate gate electrode B of the sensor FET 108_s, the substrate direct-current voltage source 120 is connected as similar to the first embodiment, and the substrate voltage VB is supplied. Note that the Schottky resistors 109 and 109d being described in the first to third embodiments accompany the sensor FET 108_s although they are omitted in FIG. 12. One terminal node NC_1 of the capacitive element C0, which is an adjusting capacitive element, is connected to the electrode (the gate electrode G) of the MOS capacitive element.

The resonating inductor 125 includes two inductors 125_1 and 125_2 which are connected in series. In other words, respective terminal nodes NL1_1 and NL2_1 of the inductors 125_1 and 125_2 are connected to each other. A power source voltage Vd is supplied to the terminal nodes NL1_1 and NL2_1 of the inductors 125_1 and 125_2. Each of the inductors 125_1 and 125_2 includes an inductor component "L" and a resistance component "R".

The above-described resonating inductor 125 and resonating capacitive element are connected in parallel to form the resonant circuit RSC. In other words, the other terminal node NL1_2 of the inductor 125_1 and the other terminal node NC_2 of the capacitive element C0 are connected to each other, and the other terminal node NL2_2 of the inductor 125_2 and the electrodes (the drain electrode D, the source electrode S) of the MOS capacitive element are connected to each other.

The drive circuit 126 includes a current source "ICnt" and two N-channel FETs "Tr1" and "Tr2". The respective source electrodes of the FETs Tr1 and Tr2 are connected to the ground voltage Vs through the current source ICnt, the gate electrode of the FET Tr1 and the drain electrode of the FET Tr2 are connected to an input/output node ND_2 of the drive circuit 126, and the gate electrode of the FET Tr2 and the drain electrode of the FET Tr1 are connected to an input/output node ND_1 of the drive circuit 126. In other words, the FETs Tr1 and Tr2 are connected as a cross-coupling connection. Note that each substrate gate electrode of the FETs Tr1 and Tr2 is connected to the source electrode.

The input/output node ND_2 of the drive circuit 126 is connected to one terminal (the terminal nodes NL1_2 and NC_2) and the output node NO of the resonant circuit RSC, and the input/output node ND_1 is connected to the other terminal (the electrodes (D, S) of the MOS capacitive element and the terminal node NL2_2) of the resonant circuit RSC.

The voltages at the input/output nodes ND_1 and ND_2 are complementarily changed at the resonant frequency of the resonant circuit RSC. In other words, the voltage at the input/output node ND_1 is alternately changed (to be an alternating current) toward the power source voltage Vd and the ground voltage Vs in a cycle of the resonant frequency. Similarly, the voltage at the input/output node ND_2 is also alternately changed (to be an alternating current) toward the power source voltage Vd and the ground voltage Vs in a cycle of the resonant frequency. Directions of the change in the voltages at the input/output nodes ND_1 and ND_2 are complementary.

The FET Tr1 in the drive circuit 126 is turned on when the input/output node ND_2 is changed toward the power source voltage Vd so as to change the input/output node ND_1 toward the ground voltage Vs. Similarly, the FET Tr2 is turned on when the input/output node ND_1 is changed toward the power source voltage Vd so as to change the input/output node ND_2 toward the ground voltage Vs. In other words, by the drive circuit 126 having the FETs Tr1 and Tr2 connected as the cross-coupling connection, the oscillation at the resonant frequency is assisted to be kept.

In the fourth embodiment, the direct-current voltage Vdc from the amplifier 117 is supplied to the gate electrode G of the sensor FET 108_s. In other words, the direct-current voltage Vdc is supplied to the gate electrode of the MOS capacitive element. In this manner, by the direct-current voltage Vdc changing in accordance with the phase difference, the capacitance value of the MOS capacitive element is changed, the resonant frequency is changed, and the frequency of the oscillating signal is changed.

Next, the operation of the detection gas sensor 211_sen illustrated in FIG. 12 will be described by using FIGS. 13A to 13C. Each of FIGS. 13A to 13C is a diagram for describing an operation of a detection gas sensor according to the fourth embodiment. FIG. 13A is a diagram illustrating the charge-voltage characteristics of the MOS capacitive element configured by the sensor FET 108_s as similar to FIG. 5A, and FIG. 13B is a diagram illustrating the gain characteristics and the phase characteristics of the resonant circuit RSC as similar to FIG. 5B.

The capacitance Cs of the MOS capacitive element changes in accordance with the voltage value of the direct-current voltage Vdc which is supplied to the gate electrode G as illustrated in FIG. 13A. In other words, when the direct-current voltage Vdc changes to the voltage values Vdc0, Vdc1, and Vdc2, the capacitance Cs of the MOS capacitive element changes to the capacitance values Cs0, Cs1, and Cs2. By the change in the capacitance Cs of the MOS capacitive element, the resonant frequency of the resonant circuit RSC is changed, and the frequency of the oscillating signal generated by the oscillation circuit OSC is also changed.

For example, when the voltage value of the direct-current voltage Vdc is "Vdc0", the capacitance Cs of the MOS capacitive element becomes "Cs0", and the resonant frequency of the resonant circuit RSC becomes "fr0". When the voltage value of the direct-current voltage Vdc increases to "Vdc1", the capacitance Cs increases to "Cs1", and the resonant frequency of the resonant circuit RSC decreases to "fr1". Further, when the voltage value of the direct-current voltage Vdc increases to "Vdc2", the capacitance Cs increases to "Cs2", and the resonant frequency of the resonant circuit RSC further decreases to "fr2".

To the controller 115, the phase detection circuit 114 supplies the phase difference between the frequency of the oscillating signal supplied through the capacitive element C1 for cutting the direct-current components and the frequency fac of the standard clock signal fac. The controller 115 outputs the direct-current voltage Vdc changing in accordance with the phase difference from the amplifier 117. When the oscillating frequency of the oscillation circuit OSC is locked at the frequency fac of the standard clock signal fac, the direct-current voltage Vdc in accordance with the phase difference between the current oscillating signal and the standard clock signal fac is supplied to the gate electrode G of the MOS capacitive element by the feedback control. The capacitance Cs of the MOS capacitive element is changed by the direct-current voltage Vdc, and the resonant frequency of the resonant circuit RSC changes, for example, from fr0 or fr2 toward fr1 illustrated in FIG. 13B. In other words, by the feedback control, the capacitance Cs of the MOS capacitive element is controlled to be Cs1. Since the feedback control is performed so that the phase difference detected by the phase detection circuit 114 is zero, the resonant frequency of the resonant circuit RSC can match the frequency of the standard clock signal fac, and the oscillating frequency of the oscillation circuit OSC is locked at the frequency of the standard clock signal fac.

As illustrated in FIG. 13B, note that a gain of the resonant circuit RSC reaches a peak at the resonant frequencies fr0, fr1, and fr2, and the phase becomes 0° C.

The resonant frequency of the resonant circuit RSC according to the fourth embodiment is expressed by an expression shown in FIG. 13C. Herein, a symbol "fr" represents the resonant frequency of the resonant circuit RSC, a symbol "C0" represents the capacitance value of the capacitive element C0, a symbol "Cs" represents the capacitance value of the MOS capacitive element configured by the sensor FET 108_s, and a symbol "L" represents the value (inductance) of the inductor 125.

Modification Example

Figure 14:
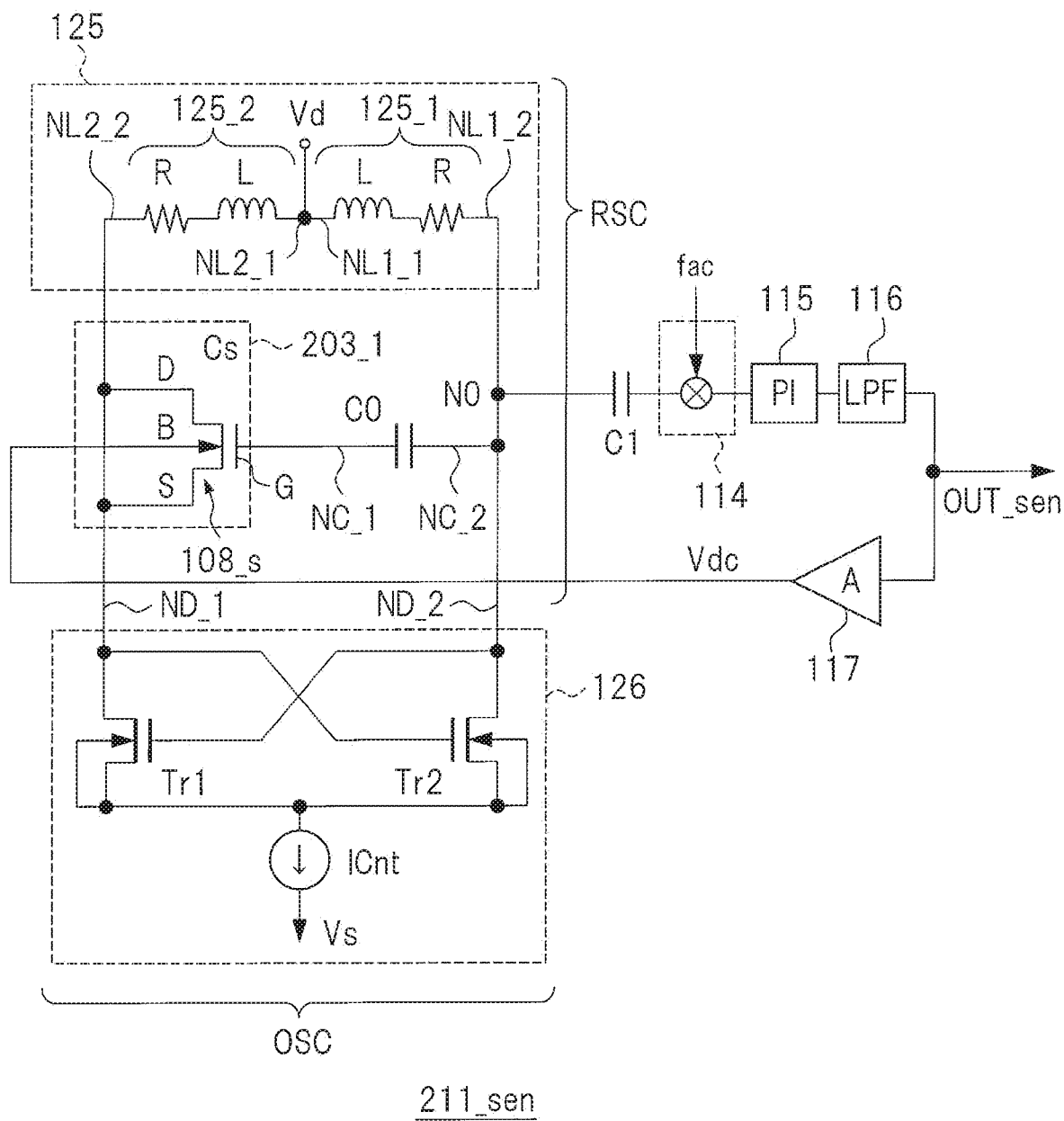
FIG. 14 is a circuit diagram illustrating a modification example of the detection gas sensor according to the fourth embodiment.

FIG. 14 is a circuit diagram illustrating a modification example of the detection gas sensor according to the fourth embodiment. A difference from the detection gas sensor illustrated in FIG. 12 is that the direct-current voltage Vdc is supplied not to the gate electrode G of the sensor FET 108_s, that is, the gate electrode G of the MOS capacitive element, but to the substrate gate electrode B. As described in the second embodiment, the capacitance Cs of the MOS capacitive element can be also changed by the change in the voltage supplied to the substrate gate electrode B.

In the fourth embodiment, it is desirable to form the sensor FET 108_s, the FETs Tr1 and Tr2, and others configuring the oscillation circuit OSC, on one chip (sensor chip) as described with reference to FIG. 11B, and it is desirable to form the other circuit blocks (114 to 117) on the control circuit 204_1 illustrated in FIG. 16. In this case, it is desirable to form each of the FETs Tr1 and Tr2 and others by not silicon but silicon carbide since the sensor chip is operated under a high temperature environment such as 500° C.

Alternatively, only the element unit 203_1 including the sensor FET 108_s may be formed on the sensor chip, and the other circuit elements (Tr1, Tr2, etc.) configuring the oscillation circuit OSC and other circuit blocks may be formed on the control circuit 204_1. In this case, the control circuit 204_1 on which the other circuit elements and the other circuit blocks have been formed is formed on a chip made of silicon, and is operated in an environment similar to the temperature environment (for example, −40° C. to 85° C. or others) where a general semiconductor device is placed. In this manner, the control circuit 204_1 can be configured by an inexpensive material, and besides, a cost can be reduced since the temperature environment for guaranteeing the operation is low. However, this case needs a wiring for connecting the sensor chip and the control circuit 204_1, and therefore, there is a need to consider a parasitic component accompanying the wiring.

In FIGS. 12 to 14, the detection gas sensor 211_sen has been exemplified and described. However, the reference gas sensor 211_ref is similarly configured. In other words, in the fourth embodiment, the oscillation circuit OSC is configured by using the resonant circuit RSC configured by the MOS capacitive element configured by the reference FET 108_r and the inductor. In the fourth embodiment, note that the oscillation circuit OSC includes the FETs which are connected in a cross-coupling mode, and thus, may be also referred to as a cross-couple oscillation circuit.

Fifth Embodiment

Figure 15A:
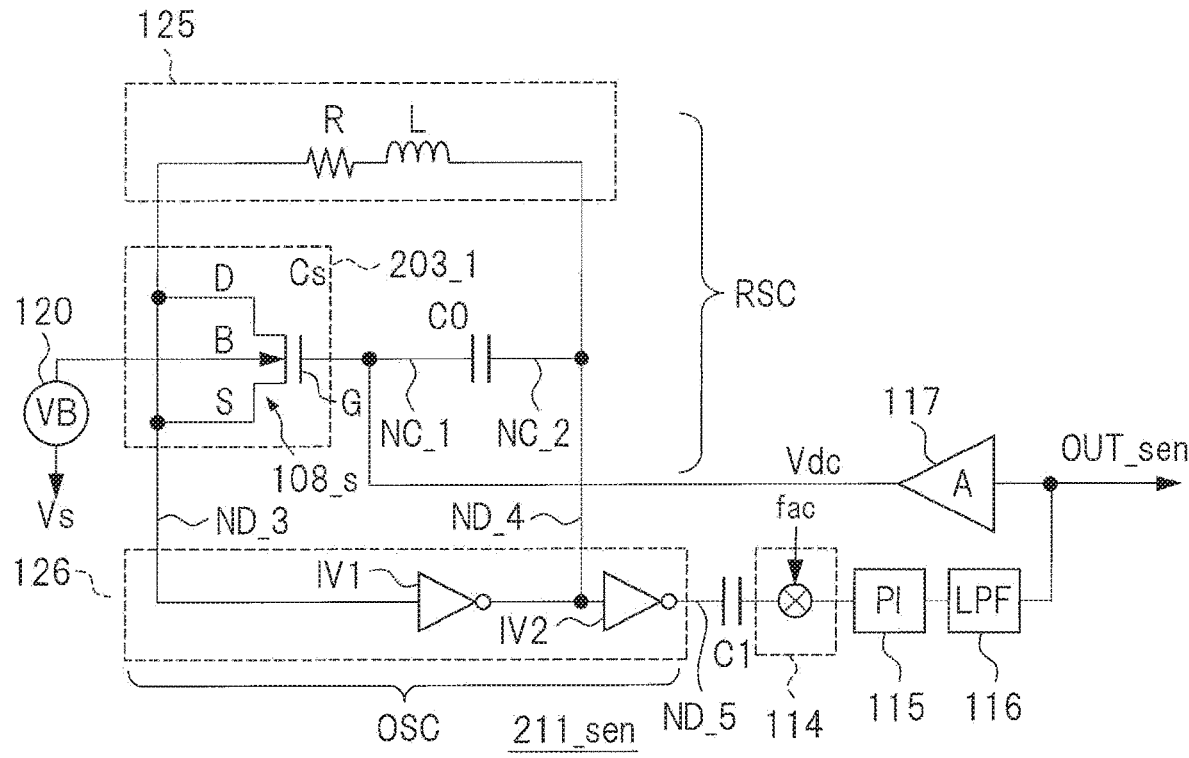
FIG. 15A is a diagram illustrating a configuration of a detection gas sensor according to a fifth embodiment.
Figure 15B:
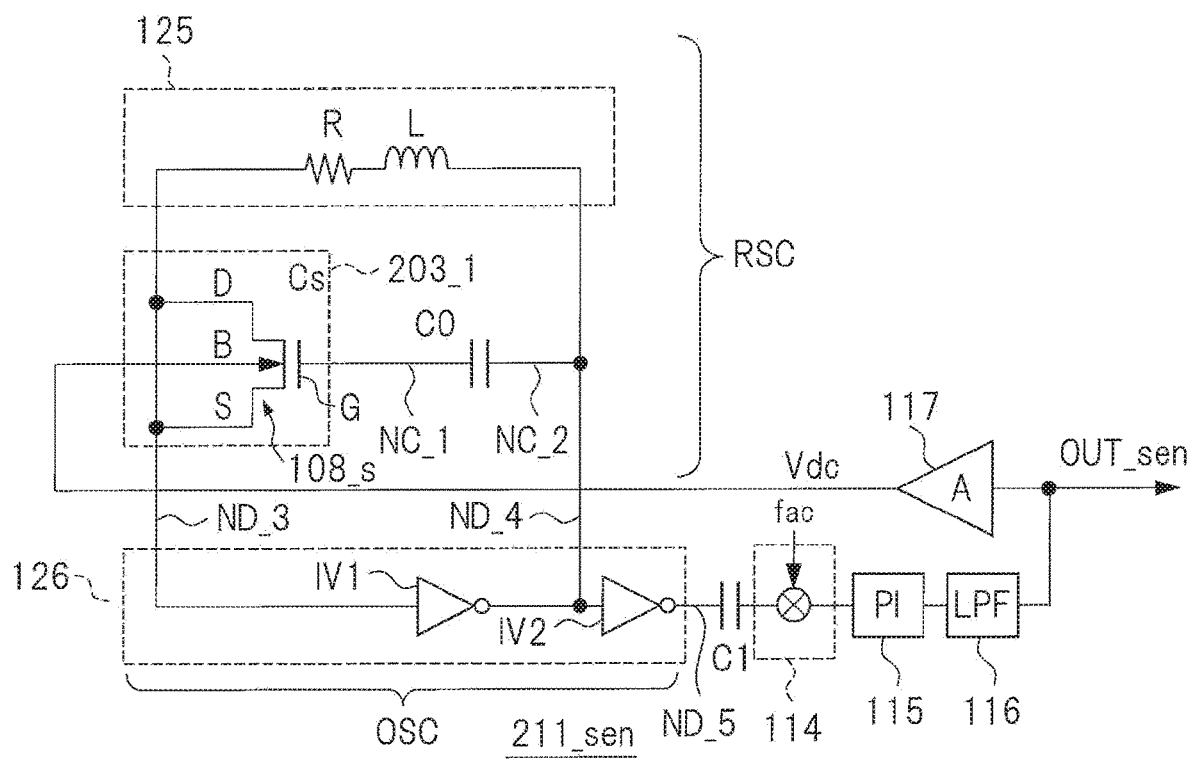
FIG. 15B is a diagram illustrating the configuration of the detection gas sensor according to a fifth embodiment.

Each of FIGS. 15A and 15B is a diagram illustrating a configuration of a detection gas sensor according to a fifth embodiment. FIG. 15A is a circuit diagram illustrating the configuration of the detection gas sensor according to the fifth embodiment, and FIG. 15B is a circuit diagram illustrating a modification example according to the fifth embodiment. FIG. 15A is similar to FIG. 12. In addition, FIG. 15B is similar to FIG. 14.

In comparison with the detection gas sensor illustrated in FIG. 12, the drive circuit forming the oscillation circuit OSC is changed. In other words, in FIG. 12, the drive circuit 126 includes the FETs Tr1 and Tr2 which are connected in the cross-coupling mode. On the other hand, in the detection gas sensor 211_sen illustrated in FIG. 15A, the drive circuit 126 is configured by two inverter circuits IV1 and IV2 which are connected in series. The inductor 125 is configured by the inductor component L and the resistance component R.

The output of the inverter circuit IV1 becomes a first output node ND_4 of the drive circuit 126, and is connected to one terminal of the resonant circuit RSC. The input of the inverter circuit IV1 becomes an input node ND_3 of the drive circuit 126, and is connected to the other terminal of the resonant circuit RSC. In addition, the output of the inverter circuit IV1 is inverted by the inverter circuit IV2, and is supplied to a second output node ND_5 of the drive circuit 126. The second output node ND_5 corresponds to the output node NO illustrated in FIG. 12.

When the voltage of the input node ND_3 changes at the resonant frequency, the inverter circuit IV1 supplies the inverted signal to the first output node ND_4. In this manner, the drive circuit 126 assists the oscillation to be kept at the resonant frequency of the resonant circuit RSC. In addition, the alternating-current signal changing in synchronization with the change of the voltage in the input node ND_3 is output from the second output node ND_5, and is supplied to the phase detection circuit 114 through the capacitive element C1 for cutting the direct-current components. Although the auxiliary operation of the drive circuit 126 is different from that of the detection gas sensor according to the fourth embodiment, the other configurations and operations are the same as those of the fourth embodiment.

FIG. 15B is different from FIG. 15A in that the direct-current voltage Vdc is supplied to the substrate gate electrode B of the sensor FET 108_s. The configuration of the drive circuit 126 is the same as that of FIG. 15A. Even in this embodiment, note that the reference gas sensor 211_ref is configured as similar to the detection gas sensor 211_sen illustrated in FIG. 15A or 15B.

The aspect, which includes the MOS capacitive element configured by the sensor FET 108_s as a component to form the oscillation circuit OSC in cooperation with the inductor and others and in which the oscillating frequency of the oscillation circuit OSC is controlled by the feedback control, can be combined with various types of oscillation circuits. For example, a configuration in which the sensor FET 108_s is provided to a frequency adjustment unit of any publicly-known oscillator as the MOS capacitive element is configured, the oscillator being a Colpitts oscillator, a differential Colpitts oscillator, a Hartley oscillator, a Clapp oscillator, a multivibrator-type oscillator, or a ring oscillator. The present invention also includes such a configuration of these oscillators as controlling the capacitance value of the MOS capacitive element by the feedback control, as locking the oscillating frequency to the standard frequency of the standard clock signal from the standard clock generating circuit 202, and as outputting the feedback voltage at this time as the gas concentration detection output.

In the first to third embodiments, such an example as the output supply of the resonant circuit RSC to the transimpedence amplifier 113 has been described. However, the capacitive element for cutting the direct-current components may be connected between the resonant circuit RSC and the transimpedence amplifier 113.

In addition, in the first to fifth embodiments, such an example as the separation of the substrate gate electrode B from the source electrode S has been described. However, the substrate gate electrode B and the source electrode S may be connected to each other. In this manner, the substrate effect can be reduced. In addition, the first to third embodiments have been described so that the alternating-current voltage source 119 forms the alternating-current voltage Vac having the same frequency as that of the standard clock signal fac. However, the alternating-current voltage source 119 is not limited to this state. Because of the phase comparison, it is only required to set an integral multiple relation between the frequency of the standard clock signal fac and the frequency of the alternating-current voltage Vac formed by the alternating-current voltage source 119.

In the first to fifth embodiments, the gas detection is executed on the basis of the change in the capacitance which changes in accordance with the gas concentration, and therefore, the gas sensors according to the first to fifth embodiments can be also considered as a capacitance detecting gas sensor.

The element units 203_1 and 203_2 including the sensor FET 108_s and the reference FET 108_r are formed on the semiconductor substrate, and the semiconductor substrate may be a silicon substrate or a silicon carbide substrate.

In the foregoing, the invention made by the present inventors has been concretely described based on the embodiments. However, it is needless to say that the present invention is not limited to the foregoing embodiments and various modifications and alterations can be made within the scope of the present invention.

What is claimed is:

1. A gas sensor, comprising:
an element unit including a field effect type sensor and a heater wire, the field effect type sensor including a gate electrode, a source electrode, and a drain electrode, and having a capacitance with a value changing in accordance with a gas concentration;
a phase detection circuit detecting a phase difference between a standard frequency and a resonant frequency of a resonant circuit formed by the capacitance of the field effect type sensor and an inductor of the heater wire; and
a feedback unit supplying a voltage changing in accordance with the phase difference detected by the phase detection circuit, to the field effect type sensor,
wherein the capacitance of the field effect type sensor is controlled by the voltage from the feedback unit so as to reduce the phase difference between the resonant frequency and the standard frequency,
wherein the gas sensor is heated by heat generated by the heater wire, and
wherein the heater wire includes:
a first heater wire connected between a first terminal, to which a first voltage is supplied, and the source electrode and the drain electrode of the field effect type sensor; and
a second heater wire connected between a second terminal, to which a voltage different from the first voltage is supplied, and the source electrode and the drain electrode of the field effect type sensor.

2. The gas sensor according to claim 1,
wherein the voltage from the feedback unit is supplied to the gate electrode of the field effect type sensor, and
the voltage from the feedback unit is output as a gas concentration detection output.

3. The gas sensor according to claim 1,
wherein the field effect type sensor includes a substrate gate electrode to which the voltage from the feedback unit is supplied, and
a fixed voltage is supplied to the gate electrode.

* * * * *